(12) United States Patent
Grebs et al.

(10) Patent No.: US 8,502,314 B2
(45) Date of Patent: Aug. 6, 2013

(54) MULTI-LEVEL OPTIONS FOR POWER MOSFETS

(75) Inventors: Thomas E. Grebs, South Jordan, UT (US); Jayson S. Preece, Riverton, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 288 days.

(21) Appl. No.: 13/091,681

(22) Filed: Apr. 21, 2011

(65) Prior Publication Data

US 2012/0267711 A1    Oct. 25, 2012

(51) Int. Cl.
*H01L 29/76* (2006.01)

(52) U.S. Cl.
USPC .... 257/341; 257/343; 257/346; 257/E29.257; 257/E21.419

(58) Field of Classification Search
USPC ........... 257/341, 343, 346, E29.257, E21.419
See application file for complete search history.

(56) References Cited

U.S. PATENT DOCUMENTS

| | | | |
|---|---|---|---|
| 4,423,547 A | 1/1984 | Farrar et al. | |
| 5,665,996 A | 9/1997 | Williams et al. | |
| 5,767,546 A | 6/1998 | Williams et al. | |
| 6,051,862 A | 4/2000 | Grimaldi et al. | |
| 6,066,877 A | 5/2000 | Williams et al. | |
| 7,504,306 B2 * | 3/2009 | Sapp et al. | 438/270 |
| 7,893,489 B2 * | 2/2011 | Kobayashi | 257/331 |
| 8,174,067 B2 * | 5/2012 | Yedinak et al. | 257/334 |

* cited by examiner

*Primary Examiner* — Minh-Loan T Tran
(74) *Attorney, Agent, or Firm* — Schwegman Lundberg & Woessner P.A.

(57) ABSTRACT

This document discusses, among other things, a semiconductor device including first and second conductive layers, the first conductive layer including a gate runner and a drain contact and the second conductive layer including a drain conductor, at least a portion of the drain conductor overlying at least a portion of the gate runner. A first surface of the semiconductor device can include a gate pad coupled to the gate runner and a drain pad coupled to the drain contact and the drain conductor.

25 Claims, 23 Drawing Sheets

MULTI-LEVEL OPTIONS FOR POWER MOSFETS

BACKGROUND

Many discrete metal oxide semiconductor field effect transistor (MOSFET) device layouts include a gate pad in a die with dimensions large enough to accommodate a bond wire or other attachment. Because of this size requirement, the gate pad can take up a large portion (e.g., 50%, etc.) of a small die. Further, because in many examples there is no active area under the gate pad, the required gate pad size can limit the active area in the semiconductor device.

FIG. 1 illustrates generally an example of a portion of a semiconductor device 100 including a source contact 102, a gate dielectric 103, a gate bus 104, a gate structure 105, a second dielectric 106, and a substrate 113. In certain examples, the gate structure 105 can include a gate pad, a gate runner, or one or more other gate contacts or gate bus structures, and can be sized to provide an adequate bonding area. In certain examples, the substrate can be isolated from the gate bus by a thin dielectric material (not shown), such as a gate oxide.

In this example, the source contact 102 is isolated from the gate structure 105 by a gap 107 configured to maintain a minimum distance, and provide proper isolation, between the gate structure 105 and the source contact 102, and the source contact 102 is isolated from the gate bus 104 by the second dielectric 106. In various examples, the inactive area of a particular semiconductor device can vary depending on the processing and design parameters used to make and operate the device. In the example of FIG. 1, the edge of the source contact 102 roughly defines an inactive area 111 below the gate bus 104 that limits an active area 108 of the semiconductor device 100. In general, an inactive area of a device, such as a power FET device, is area that cannot be used to create a functional channel to conduct current.

In an example, the active area 108 of the die can include one or more trenches forming an active trench array. In certain examples, one or more gate electrodes disposed in the active trench array can form a portion of a source region of the semiconductor device 100, a portion of which can be laterally offset from the gate structure 105. In certain examples, a lower surface of the substrate 113, substantially opposite a top working surface of the semiconductor device 100, can include a drain region of the semiconductor device 100. In certain examples, the inactive area 111 below the gate structure 105 can have a width greater than about 55 um.

OVERVIEW

This document discusses, among other things, a semiconductor device including a first metal layer coupled to a source region and a second metal layer coupled to a gate structure, wherein at least a portion of the first and second metal layers overlap to provide additional active area for the device without increasing the device size. In certain examples, an intermetal dielectric can provide electrical isolation between the portions of the first and second metal layers that overlap. In certain examples, gate structures, including pads for external connections and gate runners, can include metal portions that overlie active areas of a semiconductor device, such as active source areas of a power MOSFET device. In certain examples, a second metal layer forming a source bonding pad can extend to extremes of a device to provide improved heat transfer and current capacity. In certain examples, tie-down vias electrically coupling a poly-silicon gate runner, or an isolated poly-silicon pad, to a metal gate bonding pad can also improve adhesion of the metal gate bonding pad to the device.

In certain examples, the semiconductor device can include multiple conductive layers configured to allow custom placement of external terminals of the device, which also can provide for increased active area compared to existing devices of the same size and shape, for example, existing chip scale packaging (CSP) devices, such as power MOSFETs.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, a semiconductor device layout having first and second metal structures that at least partially overlap vertically to increase the active area of a semiconductor device without increasing the semiconductor device size. In an example, the semiconductor device layout can include a first metal coupled to a source region and a second metal coupled to a gate structure. In certain examples, the first and second metals can form portions of the first and second metal structures. In an example, a source region can include a source contact, such as a source pad or a source electrode. In other examples, the source region can include a source region of a substrate of a semiconductor device. In an example, the gate structure can include a gate pad, a gate runner, or one or more other gate contact or gate bus structures. In an example, at least a portion of a second metal layer can be configured to overlap at least a portion of a first metal layer to increase the active area of a device, such as a power FET, without increasing the size of the device die.

In certain examples, the semiconductor device layout described herein can be configured to decrease the inactive area of a semiconductor device, or a semiconductor die including one or more semiconductor devices, in turn increasing the active area of the die or the device without increasing the size of the die or the device. In certain examples, a device according to the present subject matter can be configured to reduce the size of individual semiconductor devices with respect to the gate structure, to provide flexibility in locating or sizing a gate pad on a device or on a die, to increase the available active area of the device by about 5% or more, or to improve the "on" resistance of the device, such as the drain-source resistance ($R_{DS}$) of a power transistor, for example.

Figure 2:
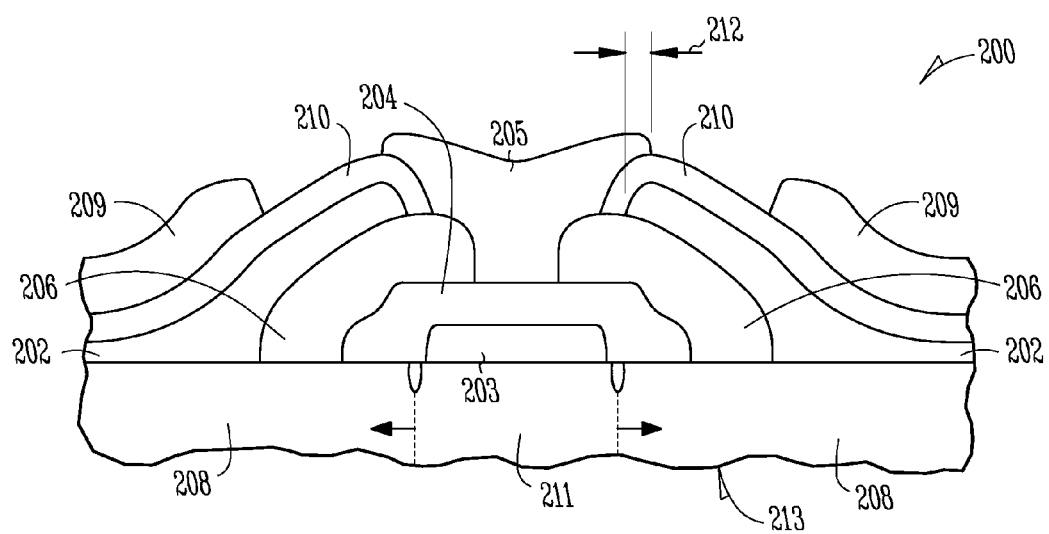
FIG. 2 illustrates generally an example of a portion of semiconductor device, such as a power transistor, according to the present subject matter.

FIG. 2 illustrates generally an example of a portion of a semiconductor device 200, such as a power transistor, including a substrate 213, a source contact 202, a gate dielectric 203, a gate bus 204, a gate structure 205, a second dielectric 206, a source pad 209, and an inter-metal dielectric (IMD) layer 210 extending between the source contact 202 and a gate structure 205. In an example, the gate structure 205 can include a gate pad, a gate runner, or one or more other gate contact or gate bus structure.

Figure 1:
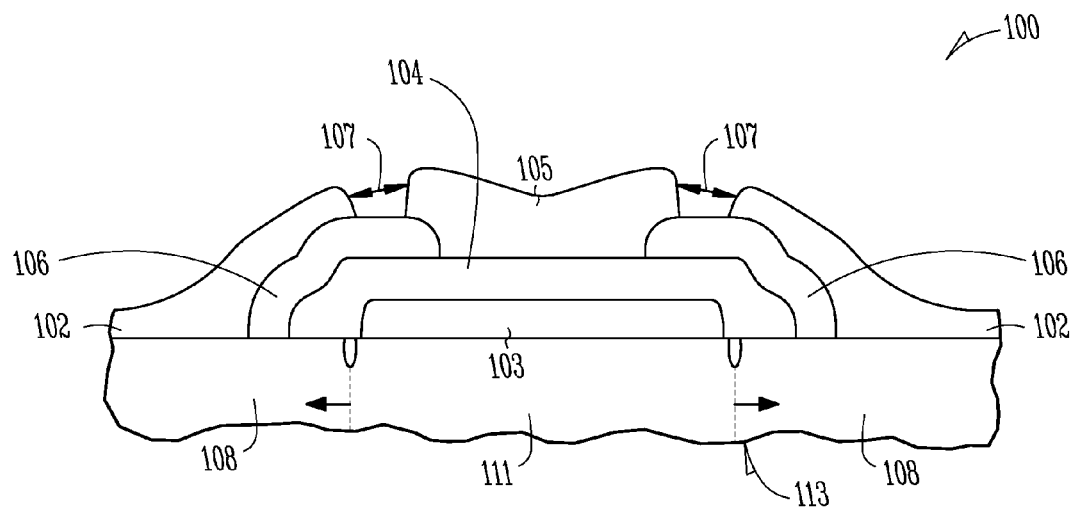
FIG. 1 illustrates generally an example of a gate runner structure.

In an example, at least a portion of the gate structure 205 can overlap at least a portion of the source region of the semiconductor device 200. In the example of FIG. 2, the IMD layer 210 insulates the gate structure 205 from the source contact 202, allowing at least a portion of the gate structure 205 to overlap at least a portion of the source contact 202, illustrated in FIG. 2 as overlap 212. This enables at least a portion of the source contact 202 to be in closer lateral proximity to, or to overlap, at least a portion of the gate bus 204. As illustrated in FIG. 1, the area under the gate bus 104 was traditionally inactive. However, the present inventors have recognized that, in certain examples, as the width of the gate bus 204 decreases (e.g., while keeping the top width of the gate structure 205 similar to that illustrated in FIG. 1), at least a portion of the active area 208 can laterally approach or vertically overlap (e.g., be underneath) at least a portion of the gate structure 205, subsequently decreasing an inactive area 211 of the semiconductor device 200, or increasing the active area 208 of the semiconductor device 200 with respect to the overall size. In an example, the width of inactive area 211 under the gate structure 205 can be reduced by about 25 um or more, e.g., when compared to a existing devices having an inactive area below a gate structure wider than about 55 um, such as illustrated in the example of FIG. 1. This reduction can result from overlapping metal portions of the gate structure 205 with metal portions of a source structure, or source region. Such techniques can allow lateral isolation gaps between the metal portions of the two structures to be reduced or eliminated and, in some examples, can allow the metal portions of the gate structures to be reduced in width. In an example, the overlapping portion of source contact 202 and the gate structure 205 can represent double metal layers allowing the active area 208 of the semiconductor device 200 to lie beneath a portion of the gate structure 205, such as a gate pad, a gate runner, etc., allowing an increase in the active area 208 of the die without increasing die size. In an example, the gate bus 204 can be configured to be coupled to one or more gate trenches forming a portion of the active area 208 of the die including the semiconductor device 200. Although the example of FIG. 2 is illustrated with reference to a power transistor, it is understood that semiconductor devices incorporating the present subject matter can include, but are not limited to, power Metal Oxide Semiconductor (MOS) Field-Effect Transistors (FETs), planar MOSFETs, Double Diffusion MOS (DMOS), Drain-in-the-back DMOS, Trench MOSFETs, including charge bound devices such as shielded gate devices, Insulated Gate Bipolar Transistors (IGBTs), MOS-Controlled Thyristors (MCTs) and temperature sense and current sense MOS devices. In an example, the source contact 202 can include a first metal layer material including, but not limited to, aluminum (Al), aluminum silicon (AlSi), aluminum silicon copper (AlSiCu), copper (Cu), or one or more other metals or combinations thereof and can include an underlying barrier metal such as Titanium (Ti), Titanium Tungsten (TiW), or Titanium Nitride (TiN). The gate structure 205 can include a second metal layer including, but not limited to, electroless nickel gold (ENiAu), titanium nickel silver (TiNiAg), titanium nickel vanadium silver (TiNiVAg), copper (Cu), solderable metals such as Tin (Sn), or one or more other metals or combinations thereof.

Figure 3:
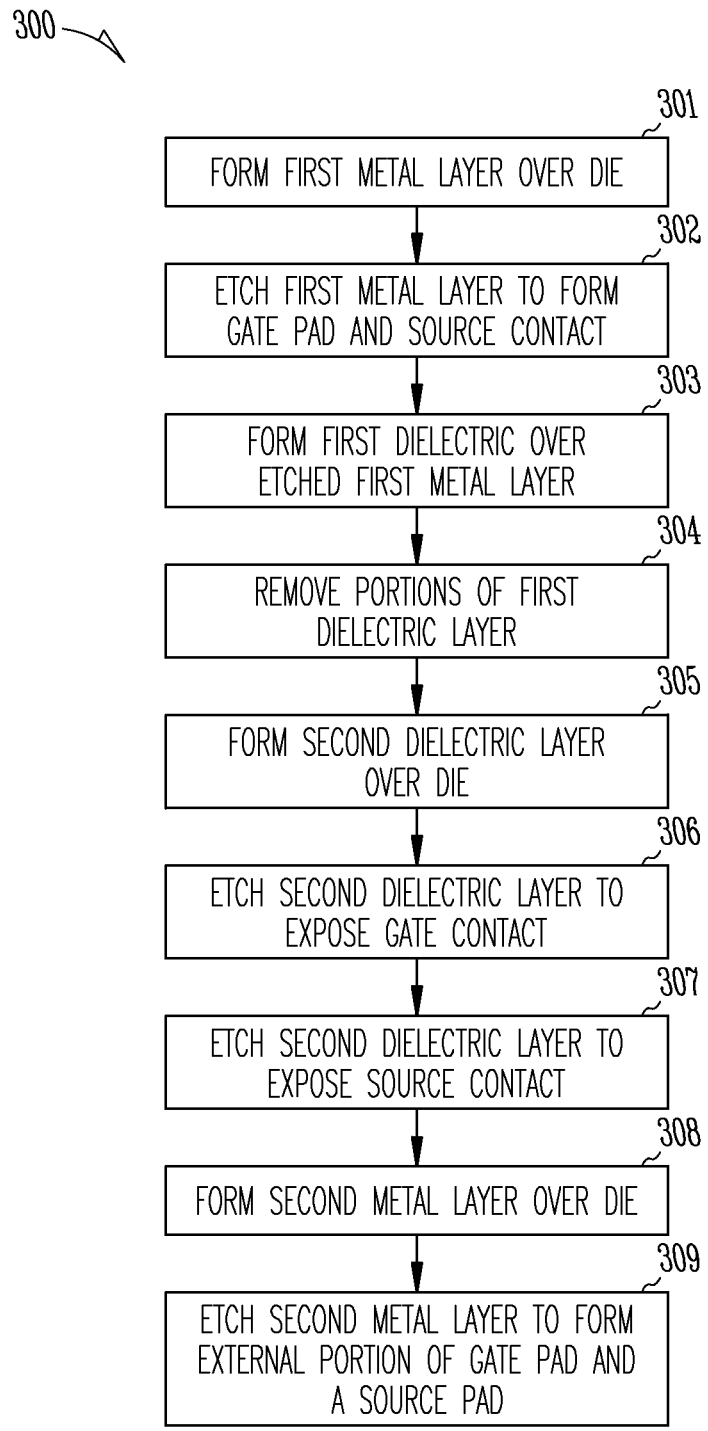
FIG. 3 illustrates generally an example of a method of making a portion of a semiconductor structure such as that illustrated in the examples of FIGS. 2 and 3.

FIG. 3 illustrates generally an example of a method 300 of making a portion of a semiconductor device, such as that illustrated in the example of FIG. 2. At 301, for example, after a substrate has been doped and trenches and gate buses formed, a first metal layer can be formed over a die. At 302, gaps or openings in the first metal layer can be etched to form a portion of a gate pad and a source contact. At 303, a first dielectric layer can be formed over the etched first metal layer. At 304, the first dielectric layer can be removed except for portions of the first dielectric material within the etched gaps of the first metal layer. At 305, a second dielectric layer can be formed over the etched first layer of metal and the dielectric filled gaps of the first metal layer. At 306, gaps or openings in the second dielectric layer can be etched to expose a portion of the first metal later comprising a portion of the gate pad. At 307, gaps or openings in the second dielectric layer can be etched to expose a portion of the first metal layer comprising a source contact. At 308, a second metal layer can be formed over the second dielectric layer and the exposed portions of the first metal layer. At 309, the second metal layer can be etched to form the gate pad and the source pad. In certain examples, the gate pad can be configured to overlap a portion of the underlying source contact and can be isolated from the source contact by un-etched portions of the second dielectric layer 305. In certain examples, at least a portion of the first metal layer can be thinner than at least a portion of the second metal layer allowing the separation dimensions of the first and second metal layers to be reduced and, consequently, providing an increase in the potential active area of the die. In an example, the first metal can be thinner than the second metal where the first and second metals overlap.

In certain examples, at 304 and 305, portions of the first dielectric layer are not removed and the second dielectric layer is not formed. In such examples, vias can be formed through etched portions of the first metal layer to allow the second metal layer to contact the gate bus and the source contact. In certain examples, one or more of the vias can be lined with a dielectric to isolate the interior of the via from the first metal layer. In some embodiments, tie down vias can be formed to reduce the resistance of the gate pad and to improve mechanical adhesion between the second metal layer forming the gate pad and the first dielectric layer. After forming the vias, the second metal layer can be formed on the first dielectric layer and etched to define a gate pad, one or more source bonding pads, and one or more optional gate runners.

Figure 4A:
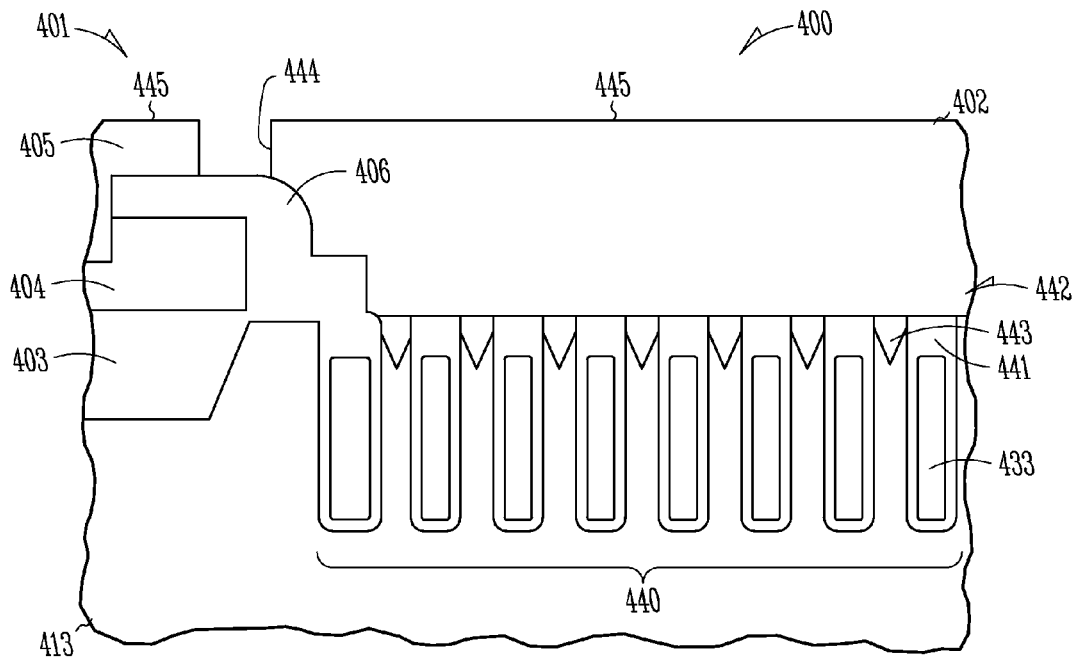
FIGS. 4A-4G illustrate generally an example of a method of making a portion of a semiconductor structure.

FIGS. 4A-4G illustrate generally examples of processing steps for a semiconductor device layout described herein. FIG. 4A illustrates generally an example of a portion of a semiconductor device 400 including a gate structure 401 (e.g., a gate pad, a gate runner, or one or more other gate contact or gate bus structure) and a plurality of trenches 440 in a substrate 413, each trench including a gate electrode 433, such as a poly-silicon electrode. In an example, the gate electrode 433 can be isolated from the substrate 413 by a trench dielectric 441. In certain examples, each of the plurality of trenches 440 can include one or more isolated electrodes. A working surface 442 of the substrate 413 can include a doped source region 443 between successive trenches of the plurality of trenches 440. In an example, the gate structure 401 can include a gate bus 404, such as a poly-silicon gate bus, a dielectric 403 configured to isolate the gate bus 404 from the substrate 413, and a dielectric layer 406 configured to isolate at least a portion of the gate structure 401 from a portion of a source area above the plurality of trenches 440. In an example, a first metal layer 445 can be disposed over the substrate 413. The first metal layer 445 can include a gap 444 (e.g., an etched gap) configured to define a portion of a gate pad 405 and a portion of a source contact 402.

Figure 4B:
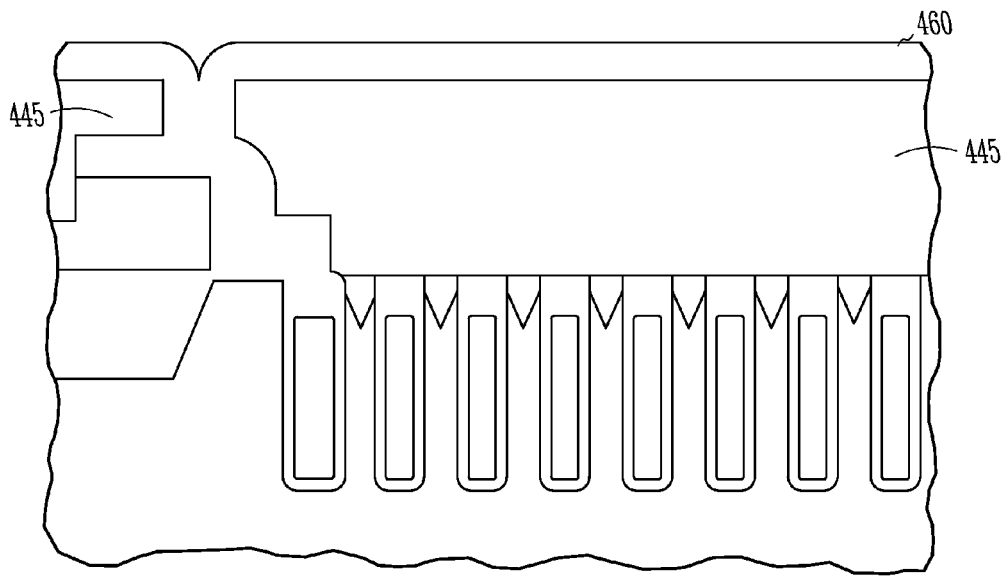

FIG. 4B illustrates generally an example of a first dielectric material 460 disposed over the first metal layer 445.

Figure 4C:
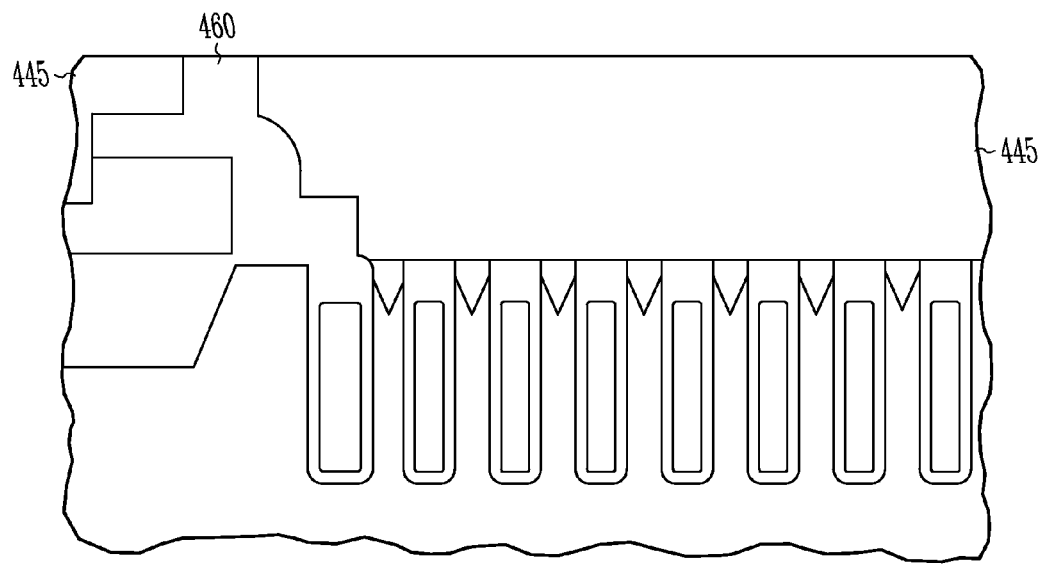

FIG. 4C illustrates generally an example of remaining portions of the first dielectric material 460 after removal from the first metal layer 445.

Figure 4D:
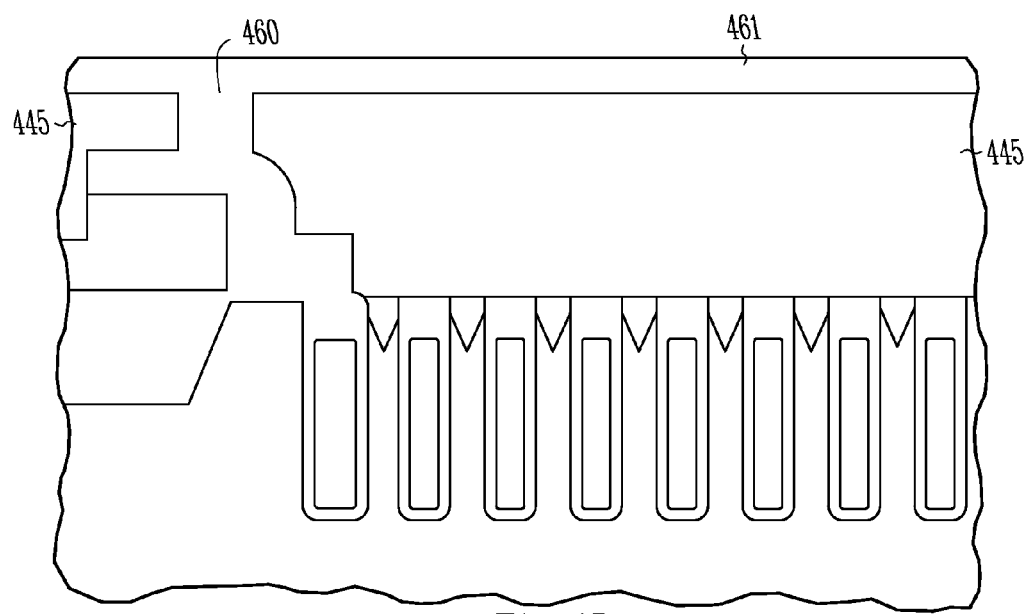

FIG. 4D illustrates generally an example of a second dielectric material 461 disposed over the first metal layer 445 and the remaining portions of the first dielectric material 460. In certain examples, the first dielectric material 460 and the second dielectric material 461 are the same dielectric material.

Figure 4E:
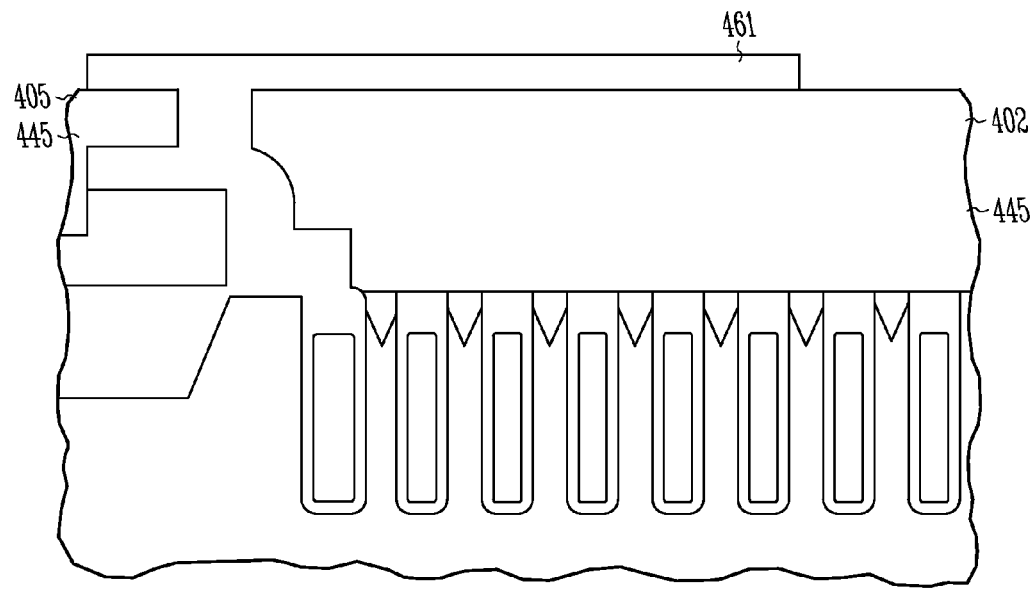

FIG. 4E illustrates generally an example of remaining portions of the second dielectric material 461 after etching to expose portions the first metal layer 445, including a portion of a gate pad 405 and a portion of a source contact 402.

Figure 4F:
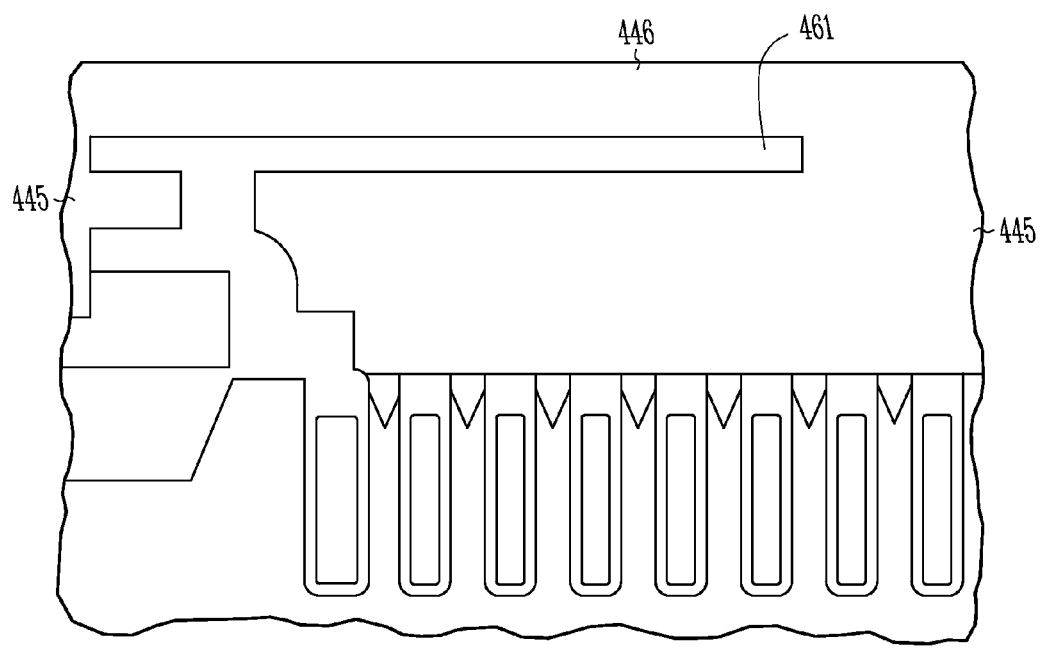

FIG. 4F illustrates generally an example of a second metal layer 446 overlying the remaining portion of the second dielectric material 461 and the exposed portions of the first metal layer 445.

Figure 4G:
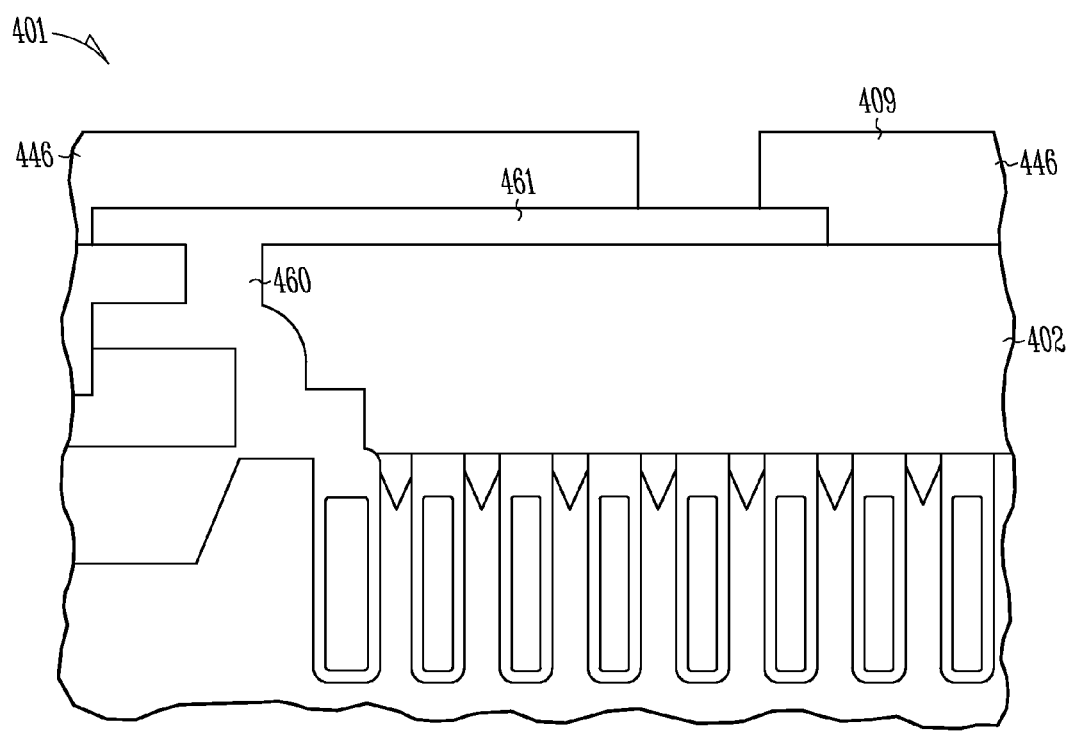

FIG. 4G illustrates generally an example of remaining portions of the second metal layer 446 after etching to isolate the gate structure 401 from a source pad 409. The combination of the first and second dielectric materials 460, 461 allow a portion of the source contact 402 to underlay a portion of the second metal layer 446 forming a portion of the gate structure 401. The portion of the source contact 402 underlying the metal portion of the gate structure 401 represents an increase in active area of a die with respect to single metal layer structures.

Figure 5A:
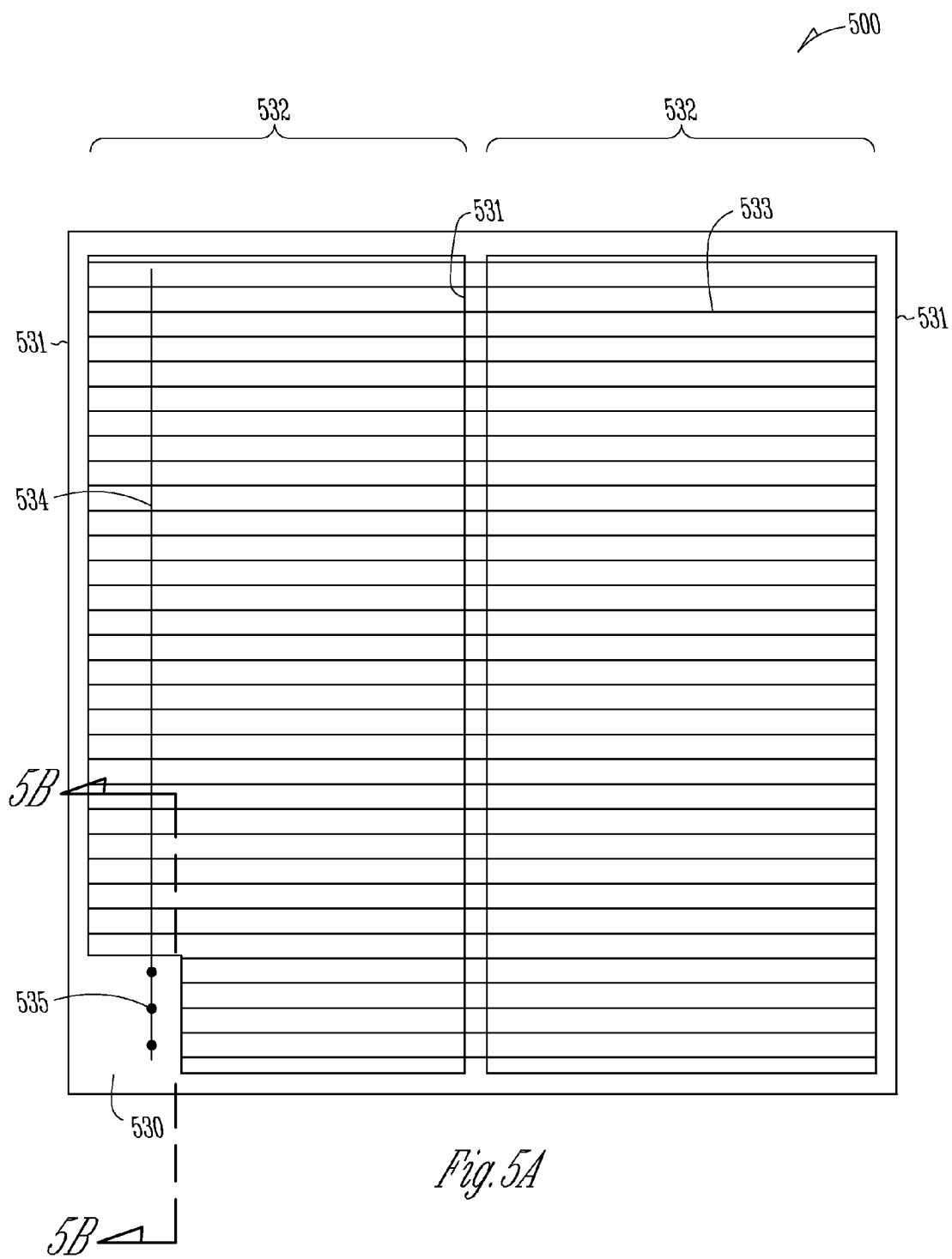
FIG. 5A illustrates generally a top view of an example of a semiconductor device.

FIG. 5A illustrates generally a top view of an example of a semiconductor die 500 including a gate pad 530, gate runners 531, and source pads 532. In an example, a plurality of gate trench electrodes, such as a gate trench electrode 533, can be configured to form a portion of an active area under a source contact coupled to the source pads 532, and can be configured to couple to one or more of the gate runners 531. In general, the gate pad 530 can be coupled to the active areas of the semiconductor die 500 using one or more of the gate runners 531 or the gate trench electrodes.

The gate pad 530 can be exposed to external forces communicated thru the bonding medium, among other things. In certain examples, the forces can act to separate the external second metal layer of the gate pad 530 from an underlying inter-metal dielectric (IMD). In certain examples, the gate pad 530 can be coupled to a buried gate runner 534 of the semiconductor die 500 using one or more tie down vias, such as a tie down via 535. In addition to providing a more robust mechanical coupling of the metal layer of the gate pad 530 to the underlying structure of the semiconductor die 500, the tie down via 535 can reduce the gate resistance of the semiconductor die 500. In certain examples, the buried gate runner can be integrated with the substrate of the semiconductor die. In certain examples, the buried gate runner can underlie a plane of the first metal layer. In certain examples, the buried gate runner can be co-planar with the first metal layer.

Figure 5B:
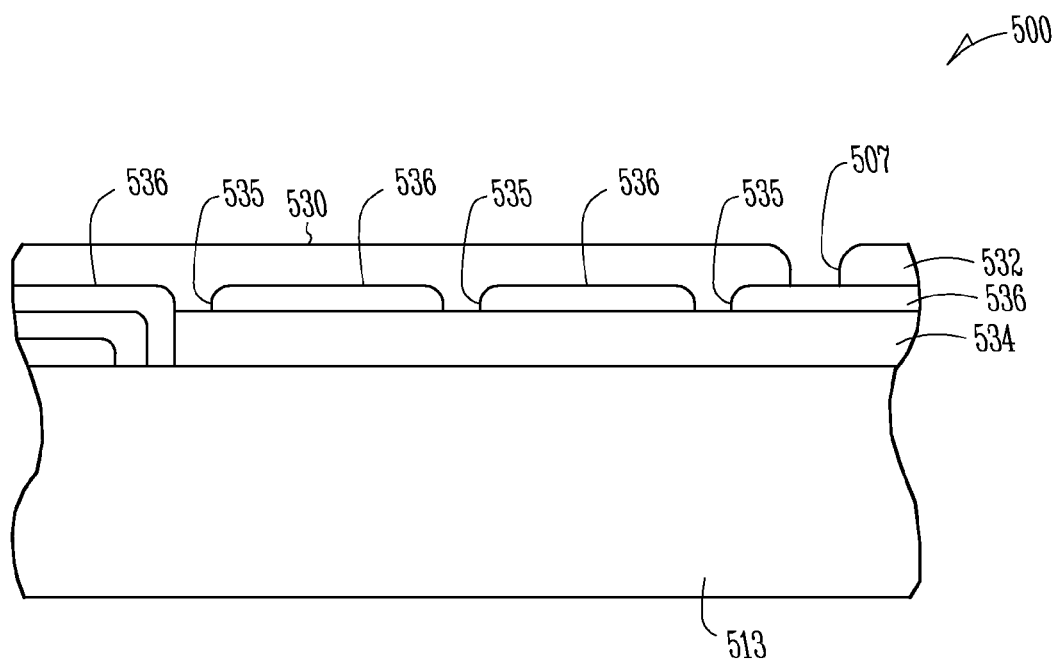
FIG. 5B illustrates generally a cross-section of an example of a semiconductor device having a trenched gate runner coupled to second metal layer gate pad using a tie-down via.
Figure 8:
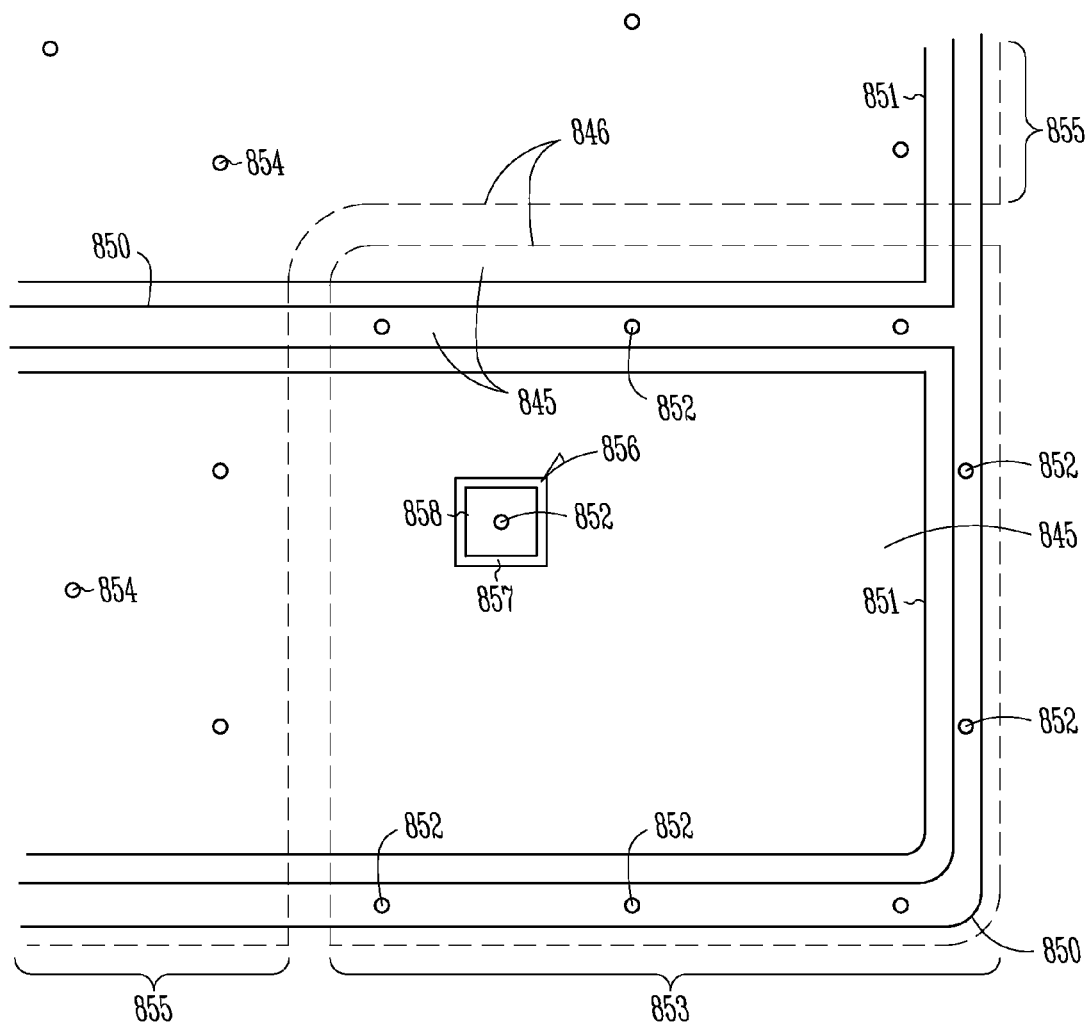
FIG. 8 illustrates generally an example of a gate runner structure including a buried first metal gate runner configuration.

FIG. 5B illustrates generally an example of a cross-section of a portion of a semiconductor die 500 having a gate pad 530 coupled to a buried gate runner, such as poly gate runner 534, using a tie-down via 535. In certain examples, one or more tie-down vias 535 extending through an inter-metal dielectric (IMD) 536 can couple the gate pad 530 to the buried poly gate runner 534. As the poly gate runner 534 extends past an edge of the gate pad 530, the IMD 536 can isolate the buried poly gate runner 534 from a source pad 532. The tie-down vias coupling the buried poly gate runner 534 to the gate pad 530 can reinforce adhesion of the metal gate pad to the device. In an example, instead of several individual tie down vias 535, a single, thin, tie-down via, extending with the length of the buried poly gate runner 534, can couple the gate pad 530 to the underlying portion of the buried poly gate runner 534. In certain examples, adhesion of the gate pad 530 can be reinforced by coupling the gate pad 530 to isolated, poly-silicon gate pad structures underlying the gate pad 530. An example of an isolated gate pad is illustrated in FIG. 8.

Figure 6:
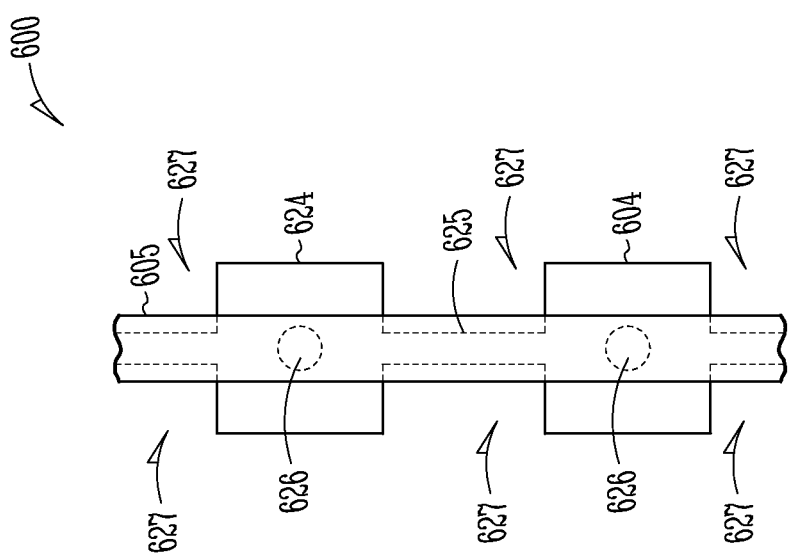

FIG. 6 illustrates generally an example of a segmented gate runner structure 600 (e.g., a segmented, second-metal gate runner structure) including a gate runner 605 composed of selected gate bus pads 604, 624 (e.g., poly-silicon gate bus pads) optionally coupled together using a thinner gate runner 625 (e.g. a poly-silicon gate runner thinner than the selected gate bus pads 604, 624 or the gate runner 605). In an example, the gate runner 605 can be optionally coupled to selected gate bus pads, such one or more of the selected gate bus pads 604, 624, using one or more vias, such as vias 626. In an example, an increased active area of a semiconductor die or a semiconductor device including the segmented gate runner structure 600 can be achieved using the thinner gate runner 625, or by optionally extending a first metal layer comprising a source contact (not shown) into the areas 627 bounded in part by adjacent selected gate bus pads 604, 624 and the thinner gate runner 625. In certain examples, a continuous sheet of the first metal layer can bridge across the gate runners 625. The sheet can extend between the gate bus pads 604, 624, as long as the sheet is electrically isolated from the thin gate runners 625.

Figure 7:
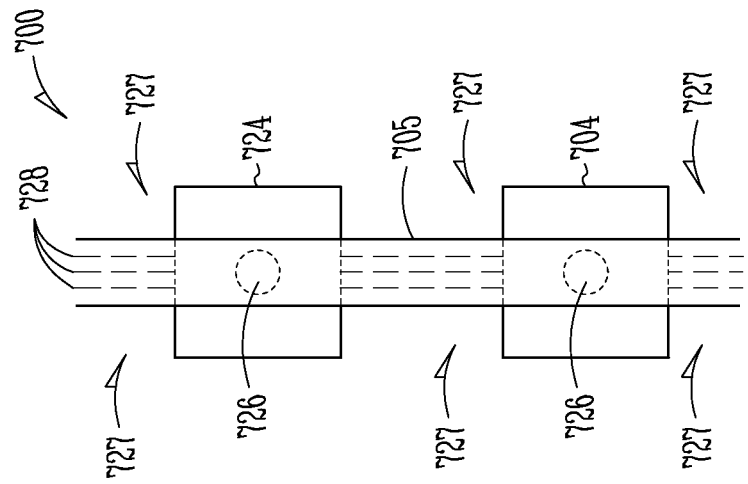
FIGS. 6-7 illustrate generally examples of segmented second metal layer gate runner structures.

FIG. 7 illustrates generally an example of a segmented gate runner structure 700 including a plurality of gate bus pads 704, 724 (e.g., poly-silicon gate pads). In an example, one or more of the plurality of gate bus pads 704, 724 can be optionally coupled together through one or more trench lines 728 intersecting the plurality of gate bus pads 704, 724. In an example, the plurality of gate bus pads 704, 724 can at least partially overlap a first metal layer (not shown) forming a portion of a source contact. In other examples, one or more of the plurality of gate bus pads 704, 724 can be further or otherwise coupled to each other using a second metal layer forming a gate runner 705 and one or more vias, such as vias 726. Each connection between the gate runner 705 and the plurality of gate bus pads 704, 724 can include a via through one or more of an inter-metal dielectric, an etched gap in the first metal layer, or a dielectric adjacent the pad. Increased active area can be achieved by etching the first metal layer forming the source contact around the vias 726 coupling one or more of the plurality of gate bus pads 704, 724 to the overlapping gate runner 705.

In an example, a segmented gate runner structure 700 formed using a second metal layer can allow a first metal layer, including a source contact, to intermittently bridge a gate runner 705 to electrically couple active areas of a semiconductor device segregated by the gate runner 705.

FIG. 8 illustrates generally an example of an alternative gate runner structure including a buried first metal gate runner configuration. In an example, a semiconductor die 800 can include a first metal layer 845 formed over the die 800 and etched to form gate runners 850 and source contact areas 851. An inter-metal dielectric (IMD) (not shown) can be configured to isolate the first metal layer 845 from a second metal layer 846 formed over the IMD and etched to define a source pad 855 and a gate pad 853. In an example, gate vias 852 can be configured to couple the gate runners 850, formed from the first metal layer, to the gate pad 853, formed from the second metal layer. In addition to providing electrical coupling, the gate vias 852 provide mechanical coupling, or adhesion, between the gate pad 853 and the underlying device components. As discussed above, existing devices include a polysilicon gate structure under the gate pad such that almost the entire area under the gate pad is inactive. A device using gate runners 850, with an underlying layer of poly silicon, does not require the use of a large polysilicon gate structure, therefore, substantially the entire area under the gate pad 853 can be active. Therefore, a device according to the present subject matter can include significant additional active with respect to existing devices without increasing the device size.

In certain examples, the gate pad 853 can be coupled to poly-silicon gate pad structures 856 underlying the metal gate pad 853 using one or more gate, or tie-down, vias 852 to provide additional adhesion of the second metal layer gate pad 853 to the underlying device structure. An isolated poly-silicon gate pad structure 856 can include a poly-silicon pad 858 and an isolation gap 857 to isolate the poly-silicon pad 858, or via 852, from a surrounding source contact area 851. In certain examples, the isolation gap 857 can include dielectric material isolating the first metal layer from the poly-silicon pad 858, or an inter-metal dielectric material isolating the first metal layer from the second metal layer, or both types of dielectric materials.

In an example, source vias 854 can couple the source contact areas 851 formed from the first metal layer 845 to the source pad 855 formed from the second metal layer 846. In certain examples, instead of or in addition to source vias 854, large windows can be etched in the IMD separating the first metal layer, forming the source contact areas 851, from the second metal layer, forming the source pad 855. In an example, the etched windows can be filled with metal, such as metal forming the second metal layer, to electrically couple the source pad 855 with the source contact areas 851.

In an example, the buried nature of the gate runners 850 formed from the first metal layer 845 can allow for a larger source contact pad 855 formed from the second metal layer 846 compared to a device having gate runners formed from the second metal layer as discussed above. In an example, the increased source contact pad 855 area can provide improved heat and current conduction, as well as a larger bonding area for bonding media, including, but not limited to, solderable bonding media or bonding clips for attaching conductors to devices or packaging external to the semiconductor die.

In certain examples, power semiconductor devices configured as chip scale package (CSP) devices, such as power MOSFETs, can benefit from multi-level configurations. In accordance with Association Connecting Electronics Industries (IPC) J-STD-012 standards, some CSP devices have all the connection pads for the device on a common surface. For power devices that incorporate a structure that includes a vertical orientation of connection nodes, the device typically accommodates routing of one or more of the connection nodes to a common surface by sacrificing active area of the device.

Figure 9:
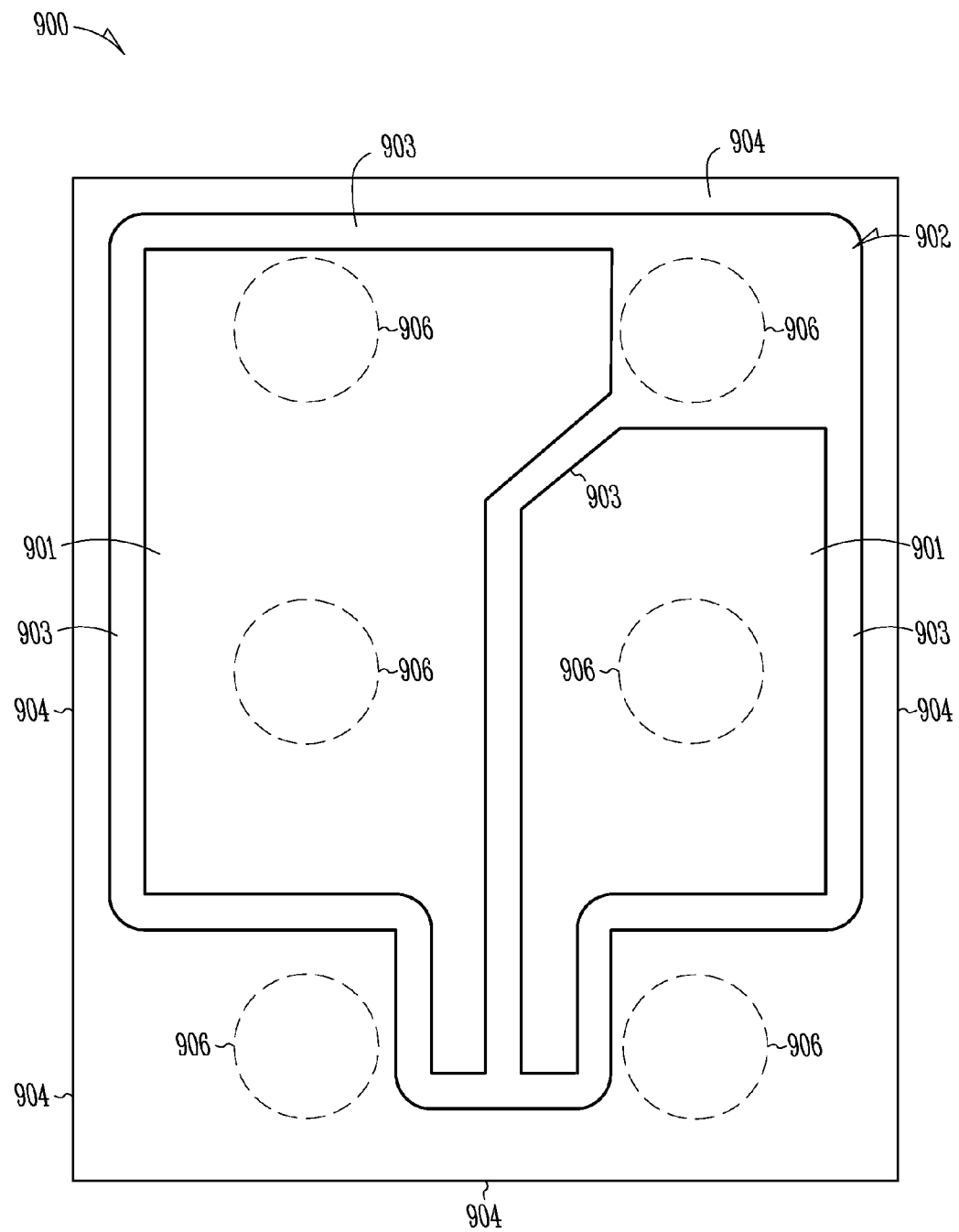
FIG. 9 illustrates generally an example of a semiconductor device, such as a power MOSFET, configured for chip scale packaging.

FIG. 9 illustrates generally an example of a semiconductor device 900, such as a power MOSFET, configured for chip scale packaging, including a top view cross-section approximately at or near an active surface of a substrate of the device 900. The device 900 includes source contact metal 901, a gate structure 902, gate runners 903, and drain contact metal 904.

The example of FIG. 9 illustrates example locations of apertures 906 through overlying materials that allow electrical connection to be made with the source contact metal 901, gate structure 902, gate runners 903, and drain contact metal 904. The apertures 906 provide routing areas such that contact pads for the source, drain and gate of the device 900 can all be located on a common overlying surface of the device 900. Note, however, a significant area of the substrate surface is dedicated to routing a connection for the drain contact metal 904.

Figure 10:
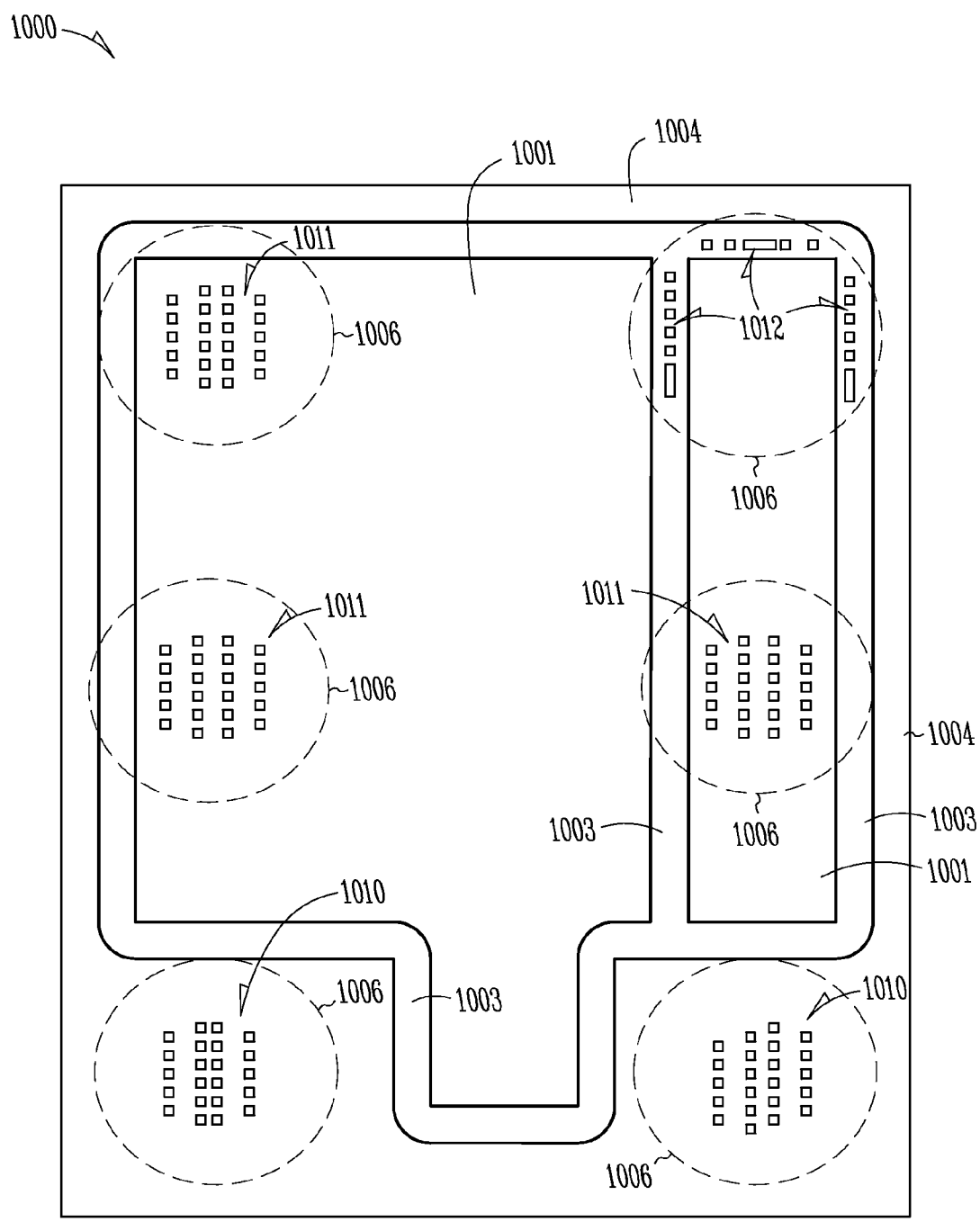
FIG. 10 illustrates generally a top view cross-section of an example device, such as a CSP power MOSFET.

FIG. 10 illustrates generally a top view cross-section of an example device 1000, such as a CSP power MOSFET, including source contact metal 1001, gate runners 1003, and drain contact metal 1004. The top view cross-section of the device 1000 includes outlines of external contacts of the device, such as solder ball locations 1006, overlying the source contact metal 1001, the gate runners 1003, and the drain contact metal 1004.

FIG. 10 further illustrates example via locations for routing conductive material to couple solder balls to the drain contact metal 1004, the gate runners 1003, or the source contact metal 1001. In an example, the device 100 can include drain vias 1010 configured to couple the drain contact metal 1004 to a drain solder ball, source vias 1011 configured to couple the source contact metal 1001 to source solder balls, or gate vias 1012 configured to couple the gate runner 1003 to a gate solder ball. In an example, one or more of the drain, source, or gate vias 1010, 1011, 1012 can extend through a dielectric material separating the solder balls from the source contact metal 1001, the gate runners 1003, or the drain contact metal 1004. In an example, vias can include a series of individual openings to provide electrical connection between two or more layers in a semiconductor device. In certain examples, vias can include a stripe opening, such as an elongate opening, segmented stripe openings, or a large opening to provide electrical connection between two or more layers in a semiconductor device. In certain examples, instead of solder balls, an overlying conductive layer can include pads, such as a source pad, a gate pad, or a drain pad.

In an example, compared to the layout of the device 900 of FIG. 9, the layout of the device 1000 of FIG. 10 can include additional active area where a gate structure would typically be located. In some examples, the layout of the device 1000 of FIG. 10 can provide about 14% more active area compared to a similarly sized device using the layout of FIG. 9.

Figure 11A:
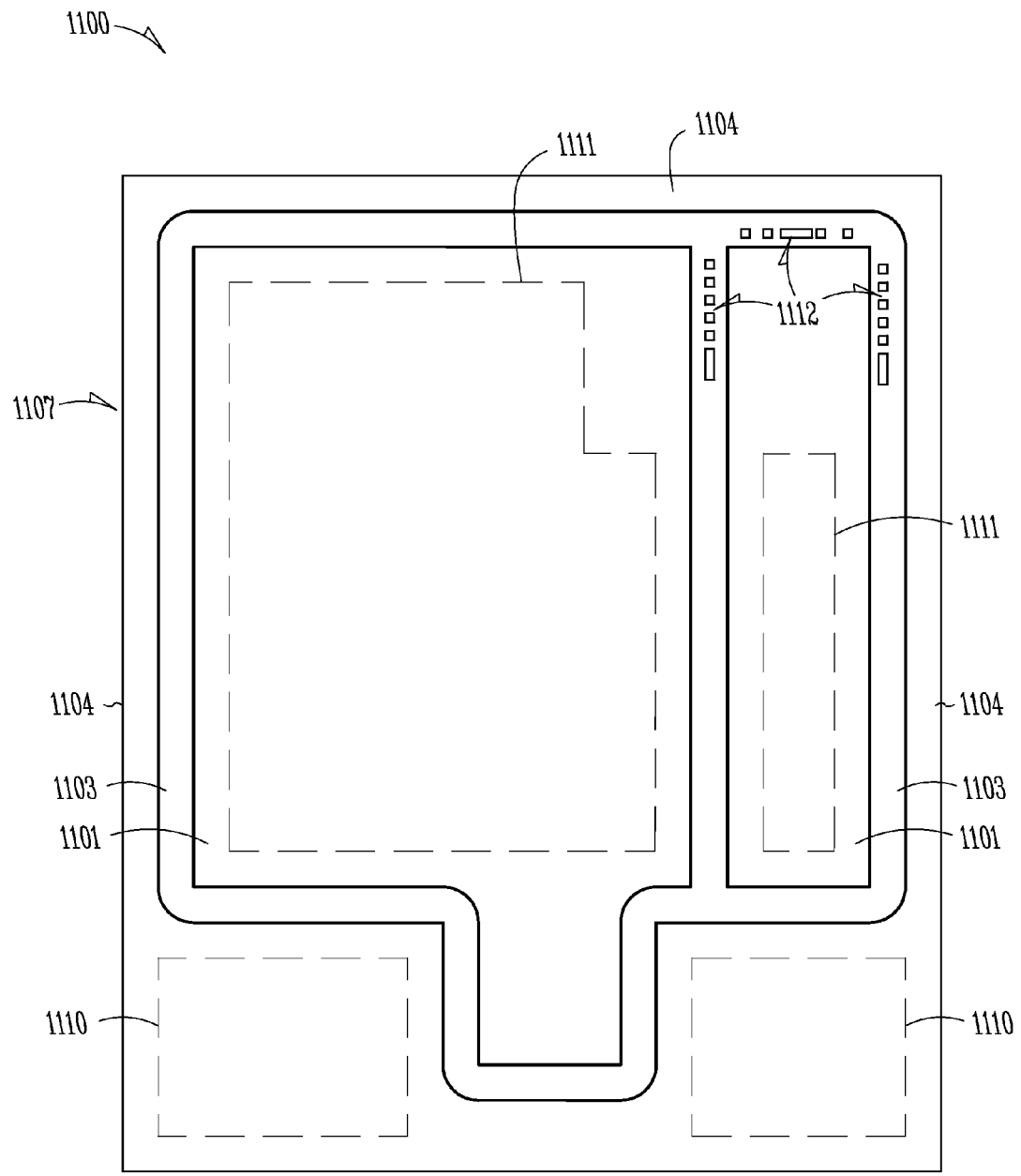
FIGS. 11A-11C illustrate generally a series of top view cross-sections for an example device, such as a CSP power MOSFET.
Figure 11B:
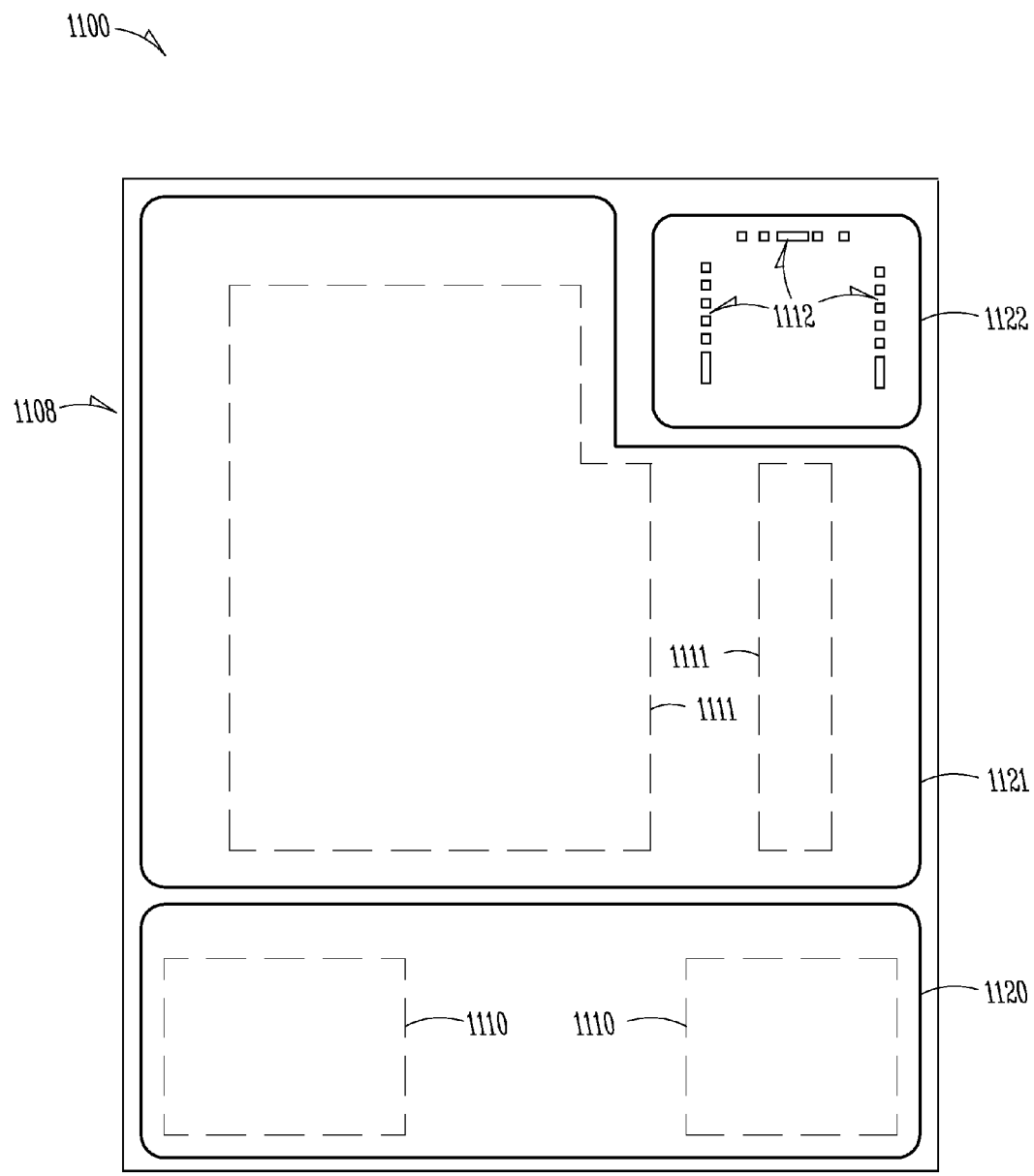
Figure 11C:
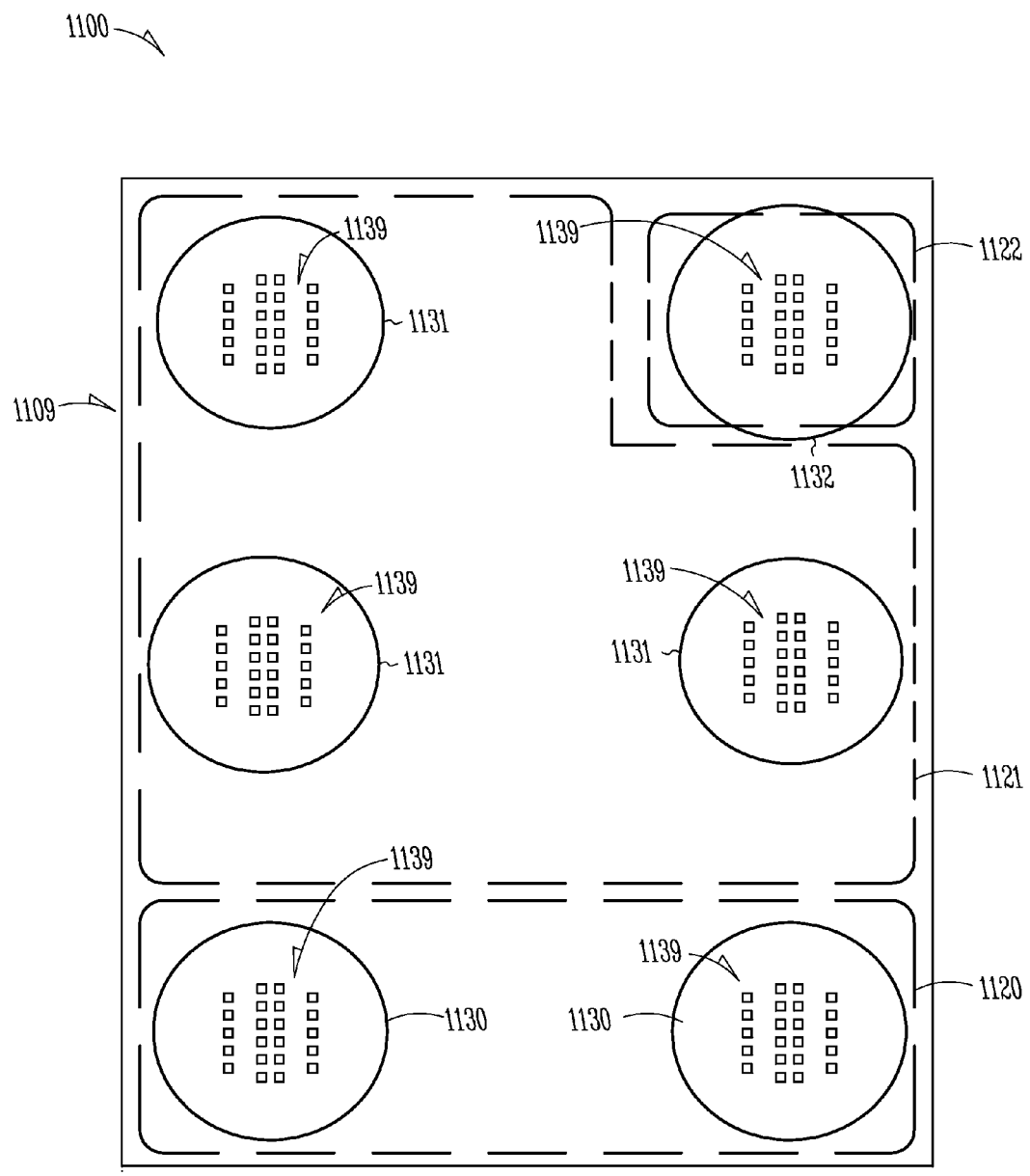

FIGS. 11A-11C illustrate generally a series of top view cross-sections for an example device 1100, such as a CSP power MOSFET. FIG. 11A illustrates generally a top down cross-section view of an example first conductive layer 1107 at or near the surface of a substrate of the device 1100. FIG. 11B illustrates generally a top down cross-section view of an example second conductive layer 1108 of the device 1100 overlying the first conductive layer 1107. FIG. 11C illustrates generally an example third conductive layer 1109 at or near an external surface of the device 1100.

Referring to FIG. 11A, in an example, the first conductive layer 1107 can include drain contact metal 1104, gate runners 1103, and source contact metal 1101. Dielectric material can overlie the first conductive layer 1107 and underlay the second conductive layer 1108. In an example, one or more vias can be used to couple portions of the first conductive layer 1107 to the second conductive layer 1108. FIG. 11A illustrates example via locations that can extend through a dielectric material positioned between the first conductive layer 1107 and the second conductive layer 1108. The one or more via locations can include, for example, locations for one or more drain vias 1110, one or more source vias 1111, or one or more gate vias 1112.

Referring to FIG. 11B, in certain examples, the second conductive layer 1108 of the device 1100 can include at least one of a drain conductor 1120 (e.g., an intermediate drain conductor), a source conductor 1121 (e.g., an intermediate source conductor), or a gate conductor 1122 (e.g., an intermediate gate conductor). In an example, the second conductive layer 1108 can overlie the first conductive layer 1107, and portions of the second conductive layer 1108 can couple to the first conductive layer 1107 using one or more vias underlying the second conductive layer 1108 and extending through dielectric material positioned between the first conductive layer 1107 and the second conductive layer 1108. The one or more vias can include one or more drain vias 1110 configured to couple the drain conductor 1120 to the drain contact metal 1104, one or more source vias 1111 to couple the source conductor 1121 to the source contact metal 1101, or one or more gate vias 1112 to couple the gate conductor 1122 to one or more gate runners 1103.

Referring to FIG. 11C, in certain examples, a third conductive layer 1109 of the device 1100 can include pads, such as at least one of a drain pad 1130, a source pad 1131, or a gate pad 1132, configured to couple the device 1100 to other devices. In an example, one or more of the drain, source, or gate pads 1130, 1131, 1132 can include solder balls coupled to one or more conductors of the second conductive layer 1108 using one or more vias 1139 extending through dielectric material positioned between the second conductive layer 1108 and the third conductive layer 1109.

The device 1100 illustrated in FIGS. 11A-11C shows one example of an external connection pattern that can be obtained using power MOSFETs with multi-conductive layers. Other external connection patterns are possible without departing from the scope of the present subject matter.

Figure 12A:
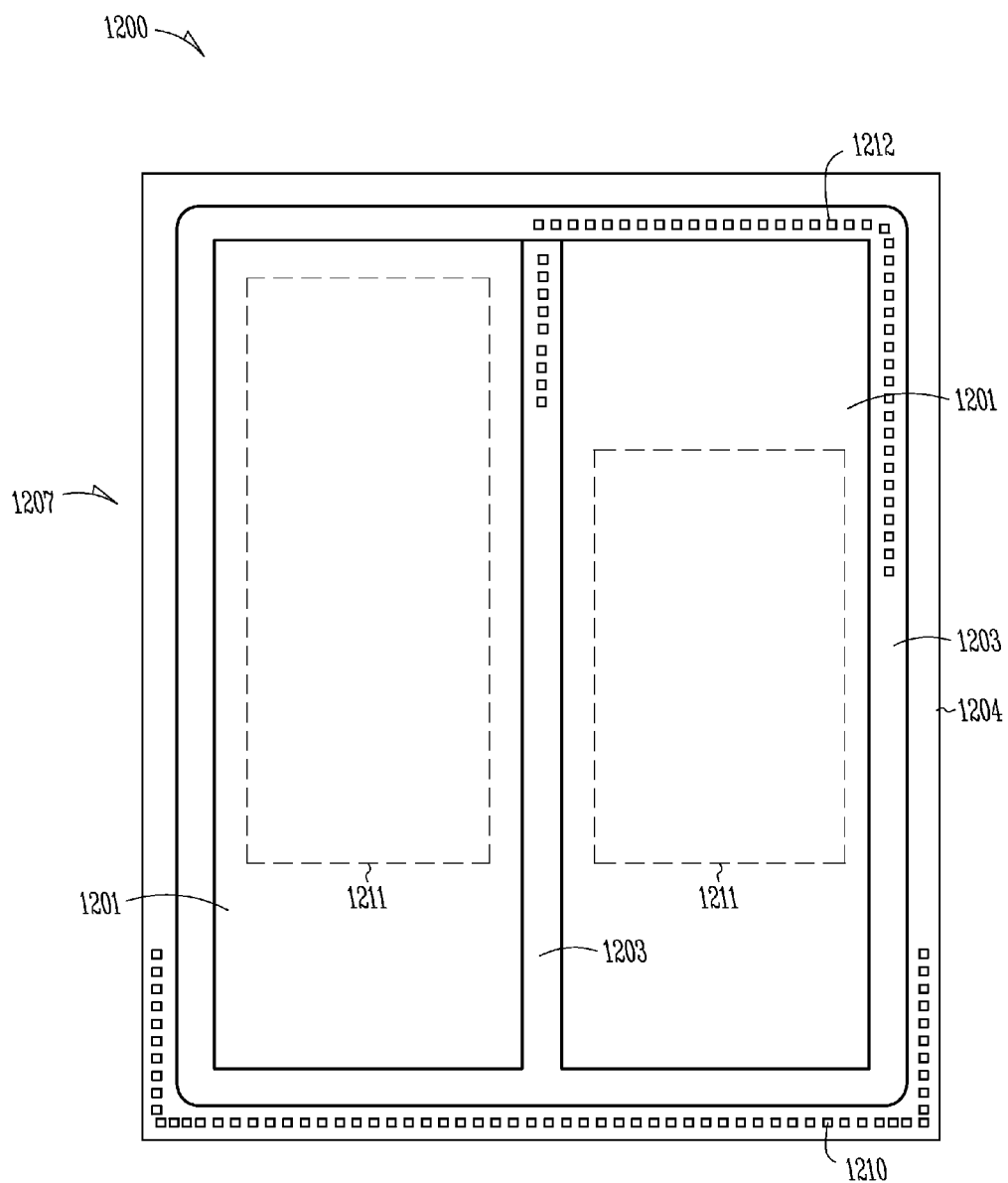
FIGS. 12A-12C illustrate generally a series of top view cross-sections for an example device, such as a CSP power MOSFET.
Figure 12B:
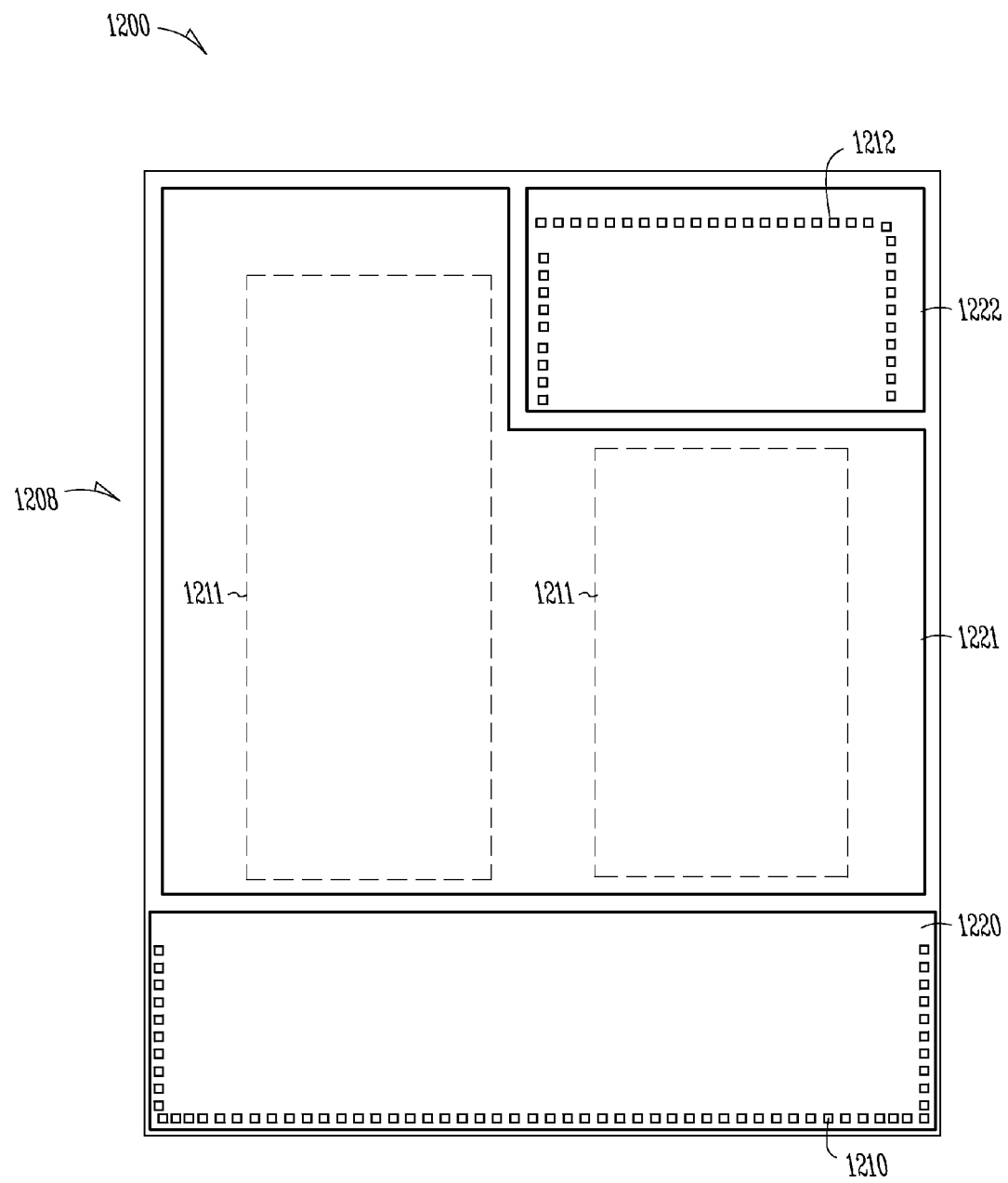
Figure 12C:
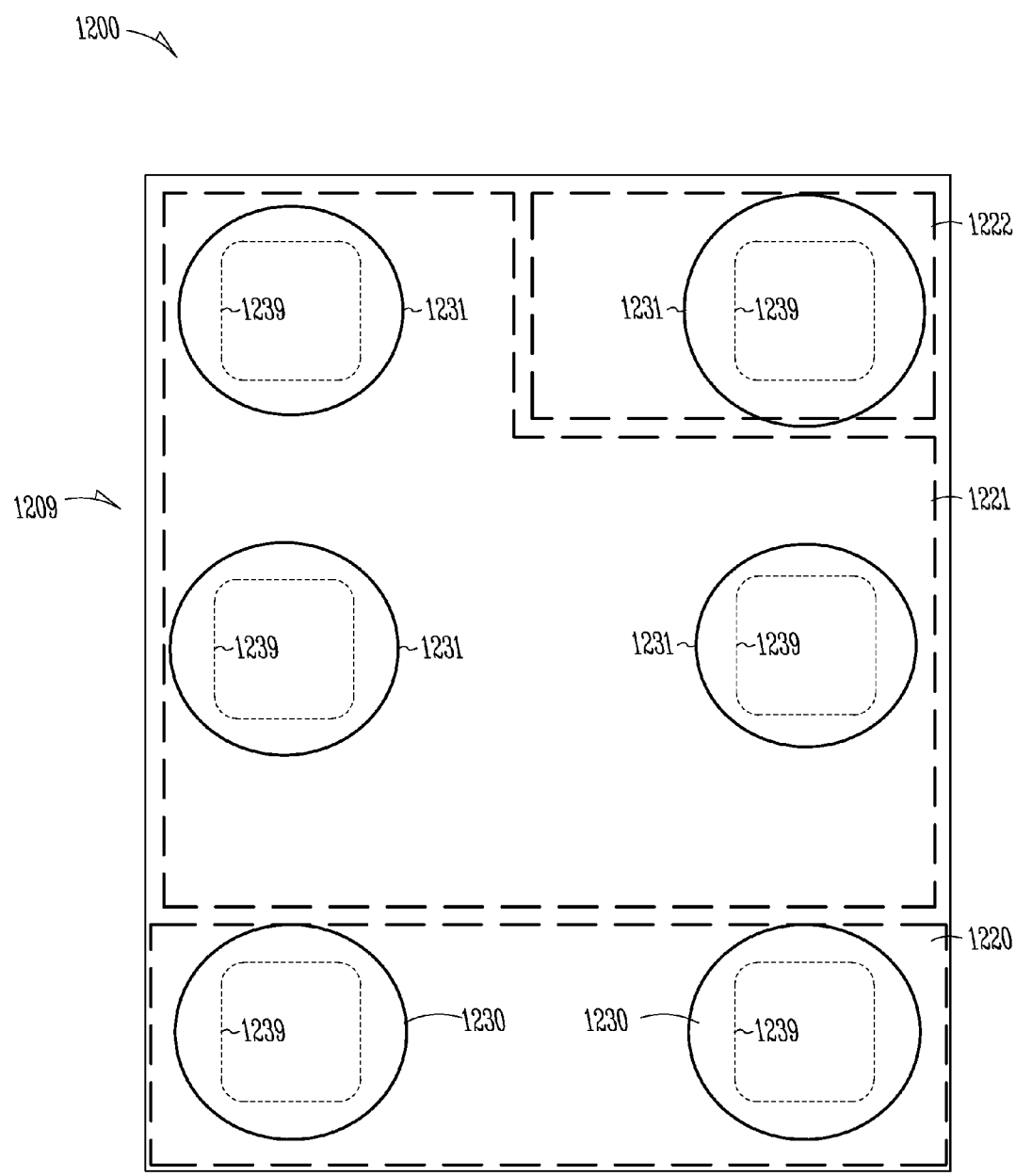

FIGS. 12A-12C illustrate generally a series of top view cross-sections of an example device 1200, such as a CSP power MOSFET. FIG. 12A illustrates generally a top down cross-section view of an example first conductive layer 1207 at or near the surface of a substrate of the device 1200. FIG. 12B illustrates generally a top down cross-section view of an example second conductive layer 1208 of the device 1200 overlying the first conductive layer 1207. FIG. 12C illustrates generally an example cross-section view of a third conductive layer 1209 at or near an external surface of the device 1200.

Referring to FIG. 12A, in an example, the first conductive layer 1207 can include drain contact metal 1204, gate runners 1203, and source contact metal 1201. Source contact metal 1201 can extend over trenched gate structures (not shown) to form an active area of the device 1200. Dielectric material can overlie the first conductive layer 1207 and underlay a second conductive layer 1208 of the device 1200. In an example, one or more vias, such as drain vias 1210 (illustrated in FIG. 12B), source vias 1211, or gate vias 1212, can be used to couple portions of the first conductive layer 1207 to the second conductive layer 1208. In an example, the drain contact metal 1204 can include a track of metal about a perimeter of the device 1200, and in certain examples, can be coupled to a lower portion of the substrate of the device 1200 using one or more drain substrate vias (not shown). In an example, the drain contact metal 1204 can include a track of metal within the interior of device 1200 (e.g. similar to the gate runners dividing the source area into several regions), or a combination of perimeter and interior drain contact metal. In an example, the drain contact metal 1204 can include a substantially uniform width about the perimeter of the device 1200. In some examples, the layout of FIG. 12A can provide about 37% more active area compared to a similarly sized device using the layout of FIG. 9. In certain example, the gate runners 1203 can be coupled to the trenched gate structures in the device 1200.

It is understood that other patterns of the drain contact metal 1204 or the gate runners 1203 of the first conductive layer 1207 are possible without departing from the present subject matter. For example, in certain embodiments, the width of the drain contact metal 1204 can be varied to reduce the resistance of the device 1200. In an example, the width of the drain contact metal 1204 distal from the drain vias 1210 can be wider that the drain contact metal 1204 near the drain vias 1210 to reduce resistance of the device 1200. In certain examples, the gate runners 1203 can have different widths to reduce resistance of the device 1200. In some examples, wider gate runners 1203 can accommodate larger gate vias 1212. In certain examples, the larger gate vias 1212 can provide better adhesion of overlying gate material of a multi-level device 1200.

Referring to FIG. 12B, in certain examples, the second conductive layer 1208 can include at least one of a drain conductor 1220 (e.g., an intermediate drain conductor), a source conductor 1221 (e.g., an intermediate source conductor), or a gate conductor 1222 (e.g., an intermediate gate conductor). In an example, the second conductive layer 1208 can overlie the first conductive layer 1207 illustrated in the view of FIG. 12A. Portions of the second conductive layer 1208 can couple to the first conductive layer 1207 using one or more vias underlying the second conductive layer 1208 and extending through dielectric material positioned between the first conductive layer 1207 and the second conductive layer 1208. The one or more vias can include one or more drain vias 1210 to couple the drain conductor 1220 to the drain contact metal 1204, one or more source vias 1211 to couple the source conductor 1221 to the source contact metal 1201, or one or more gate vias 1212 to couple the gate conductor 1222 to one or more gate runners 1203. In an example, such as in a two-layer device, the second conductive layer 1208, including at least one of the drain conductor 1220, the source conductor 1221, or the gate conductor 1222, can form the pads of the device 1200. In an example, a surface of each of the pads can be coplanar to each other. In an example, the pads can be coplanar to each other and substantially coplanar to a surface of the device 1200.

Referring to FIG. 12C, in certain examples, the third conductive layer 1209 can include one or more pads, such as drain pads 1230, source pads 1231, or gate pads 1232, to couple the device 1200 to other devices. In an example, one or more of the pads can include solder balls coupled to one or more of the drain conductor 1220, the source conductor 1221, or the gate conductor 1222 of the second conductive layer 1208 using one or more vias, such as via 1239 extending through the dielectric material positioned between the second conductive layer 1208 and the third conductive layer 1209. The device 1200 illustrated in FIGS. 12A-12C shows one example of an external connection pattern that can be obtained for a power MOSFET with multi-conductive layers. In other examples, other external connection patterns are possible without departing from the scope of the present subject matter.

Figure 13:
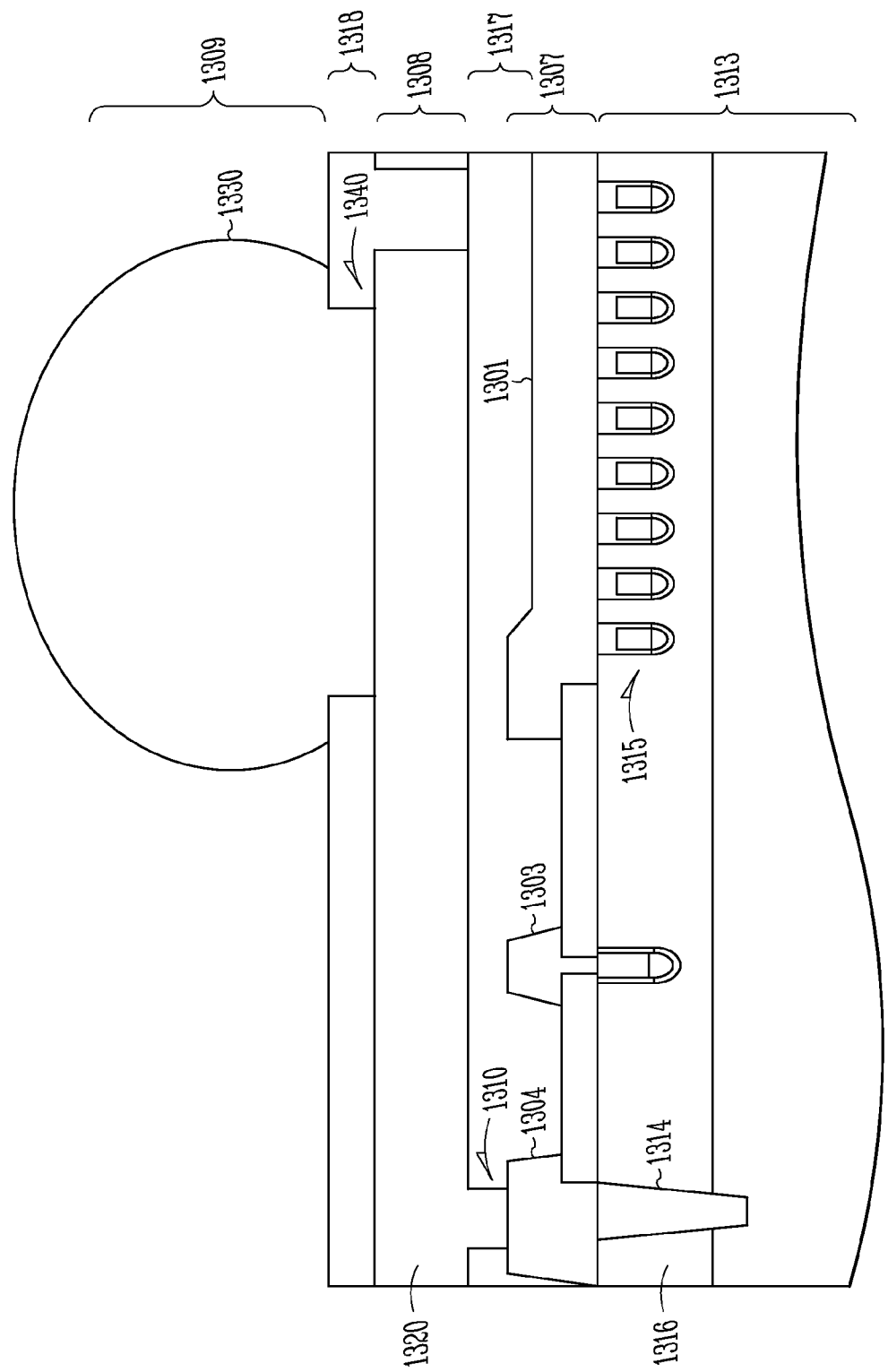
FIG. 13 illustrates generally an example cross-section view of a device, such as a power MOSFET.

FIG. 13 illustrates generally an example cross-section view of a device 1300, such as a power MOSFET, extending from a substrate 1313 through overlying materials including first, second, and third conductive layers 1307, 1308, 1309. In an example, the first conductive layer 1307 can include drain contact metal 1304, a gate runner 1303, and source contact metal 1301. In an example, the gate runner 1303 can include polycrystalline silicon, a metallic compound (e.g., a metallic compound produced by a metal gate process), a metal compound and polycrystalline silicon (e.g. a metal material overlying polycrystalline material), or metal such as, but not limited to, Al, AlSi, AlSiCu. In an example, the gate runner 1303 can include a silicided polycrystalline silicon gate runner, providing a lower resistance gate runner, thus reducing the size of the gate runner 1303 or increasing a capacity of the device 1300.

In an example, the drain contact metal 1304 can be in electrical communication with a drain substrate via 1314 extending into the substrate 1313, and a gate runner 1303 can be in electrical communication with a plurality of trenched gate structures 1315. In an example, the drain substrate via can extend into an epitaxial layer 1316 of the substrate 1313. The plurality of trenched gate structures 1315 can underlay the source contact metal 1301, and in certain examples, can control a flow of electrical current between the source contact metal 1301 and the drain contact metal 1304 when a voltage is applied to the gate runner 1303.

In an example, the second conductive layer 1308 can be separated from the first conductive layer 1307 using a first dielectric layer 1317, and can include a drain conductor 1320 coupled to the drain contact metal 1304, for example, using one or more drain vias 1310 in the first dielectric layer 1317. In an example, the drain via 1310 can couple the drain conductor 1320 to the drain contact metal 1304.

In certain examples, the drain conductor 1320 can overlie the gate runner 1303, or source contact metal 1301, and can be used as a drain pad for coupling the device 1300 to other electronics.

In an example, the third conductive layer 1309 can include a drain pad 1330. In certain examples, the drain pad 1330 can include a drain solder ball. In an example, the second conductive layer 1308 can be separated from the third conductive layer 1309 using a second dielectric layer 1318, and the drain pad 1330 can be coupled to the drain conductor 1320 using one or more drain vias 1340 extending through the second dielectric layer 1318. In an example, the drain conductor 1320 can provide a medium to allow custom placement of the drain pad 1330 independent of the location of the underlying drain contact metal 1304. In certain examples, the drain pad 1330 can have a planar upper surface.

Figure 14:
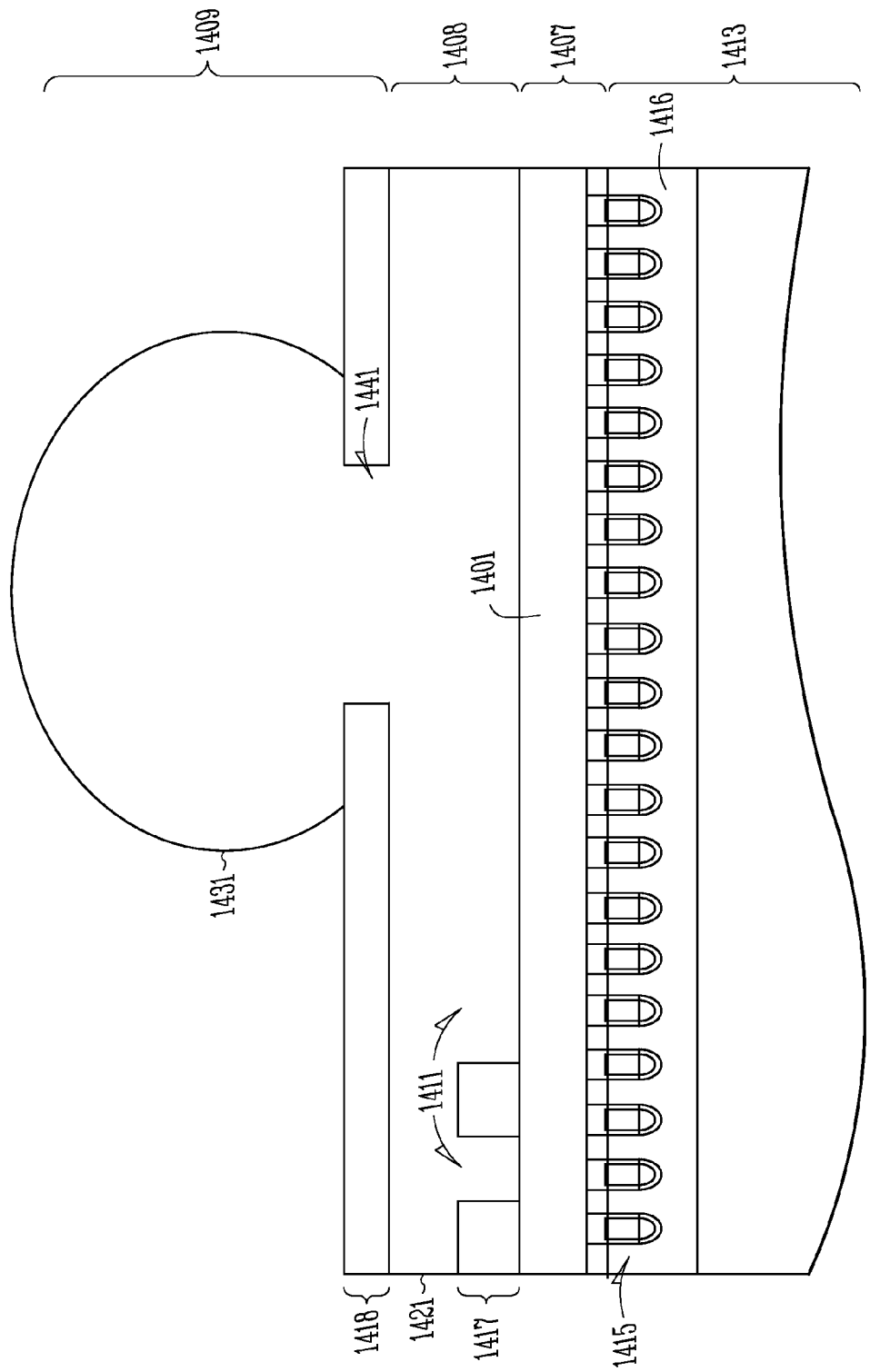
FIG. 14 illustrates generally an example second cross-section of a device.

FIG. 14 illustrates generally an example of a second cross-section of a device 1400 extending from a substrate 1413 through overlying materials including first, second, and third conductive layers 1407, 1408, 1409. In an example, the substrate 1413 can include an epitaxial layer 1416.

In an example, the first conductive layer 1407 can include source contact metal 1401 and can overlie a plurality of trenched gate structures 1415. The second conductive layer 1408 can include a source conductor 1421 coupled to the source contact metal 1401, and can be separated from the first conductive layer 1407 using a first dielectric layer 1417. In certain examples, the source conductor 1421 can couple to the source contact metal 1401 using source vias 1411 in the first dielectric layer 1417. In an example, the source conductor 1421 can be used as a source pad 1431 for coupling the device 1400 to other electronics, and can overlie at least one of drain contact metal or a gate runner.

In an example, the third conductive layer 1409 can include the source pad 1431. In certain examples, the source pad 1431 can include a source solder ball. In an example, the second conductive layer 1408 can be separated from the third conductive layer 1409 using a second dielectric layer 1418, and the source pad 1431 can be coupled to the source conductor 1421 using one or more source vias 1441 extending through the second dielectric layer 1418. In an example, the source conductor 1421 can provide a medium to allow custom placement of the source pad 1431 independent of the location of the underlying source contact metal 1401. In certain examples, the source pad 1431 can have a planar upper surface.

Figure 15:
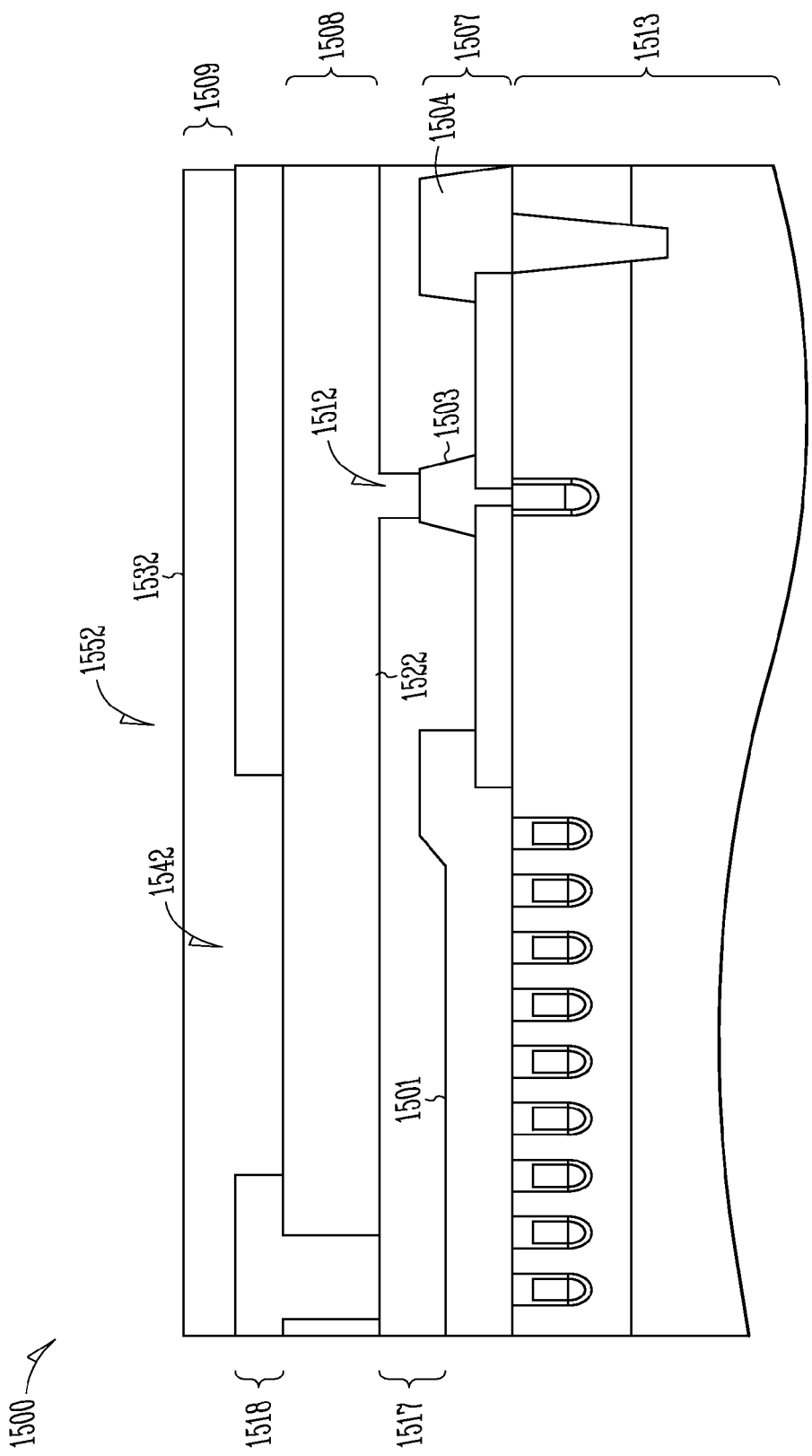
FIG. 15 illustrates generally an example cross-section of a device.

FIG. 15 illustrates generally an example of a cross-section of a device 1500 extending from a substrate 1513 through overlying materials including first, second, and third conductive layers 1507, 1508, 1509. In an example, the substrate 1513 can include an epitaxial layer, and at least one of the substrate 1513 or the epitaxial layer can include a trench to support a gate runner 1503.

In an example, the first conductive layer 1507 can include drain contact metal 1504, a gate runner 1503, and source contact metal 1501. In an example, the first conductive layer 1507 can be separated from the second conductive layer 1508 by a first dielectric layer 1517.

In an example, the second conductive layer 1508 can include a gate conductor 1522 coupled to the gate runner 1503 using one or more gate vias 1512 extending through the first dielectric layer 1517. In certain examples, the gate conductor 1522 can overlie at least one of the source contact metal 1501 or the drain contact metal 1504. In an example, the gate conductor 1522 can be used as a gate pad for coupling the device to other electronics. In an example, the second conductive layer 1508 can be separated from the third conductive layer 1509 by a second dielectric layer 1518.

In an example, the third conductive layer 1509 can include a gate pad 1532 coupled to the gate conductor 1522 using one or more gate vias 1542 extending through the second dielectric layer 1518. In certain examples, the gate pad 1532 can include a gate solder ball. In an example, the gate conductor 1522 can provide a medium to allow custom placement of the gate pad 1532 independent of the location of the underlying gate runner 1503. In certain examples, the gate pad 1532 can have a planar upper surface 1552.

Figure 16:
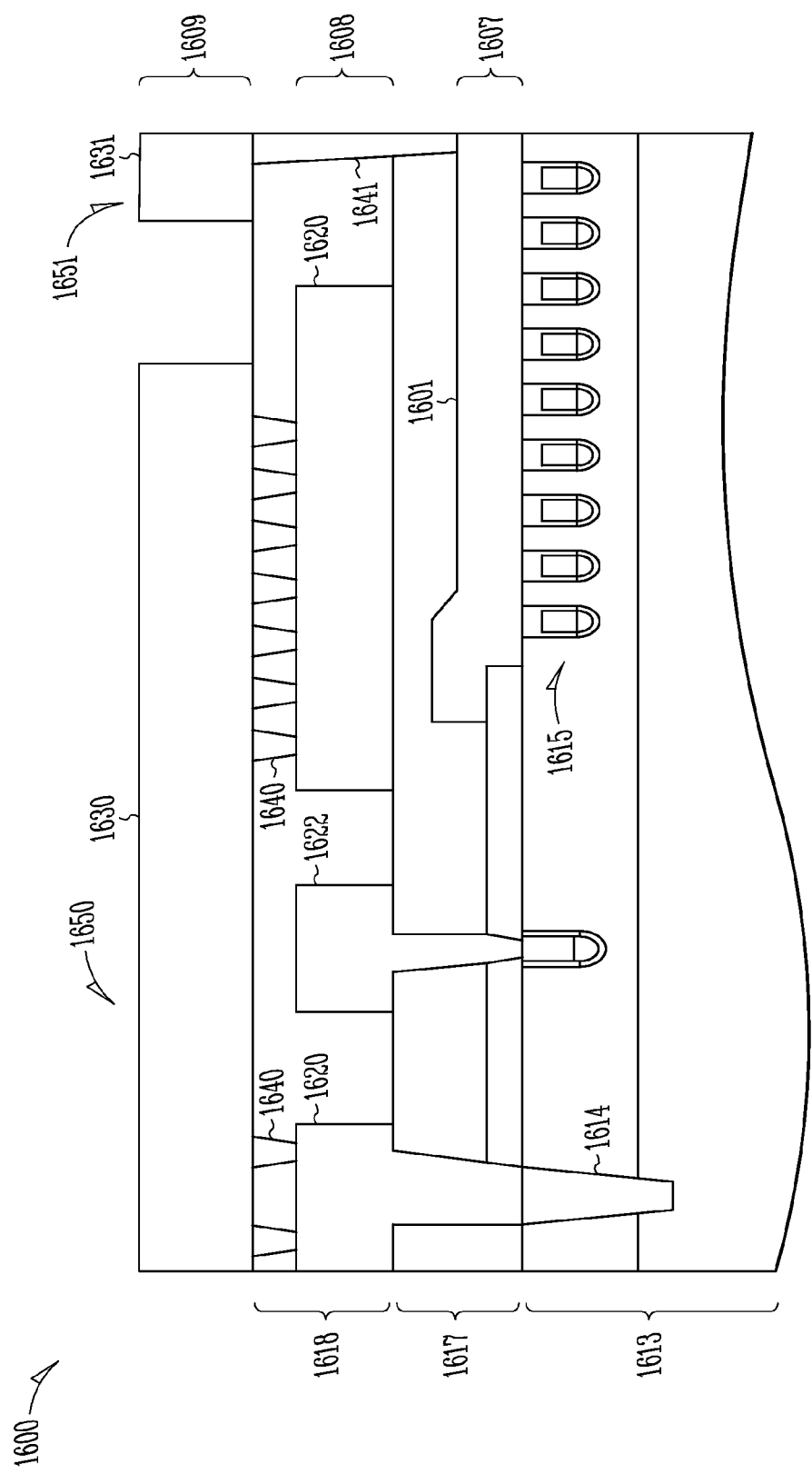
FIG. 16 illustrates generally an example cross-section of an alternative multi-level device.

FIG. 16 illustrates generally an example cross-section of an alternative multi-level device 1600 including a substrate 1613, a first conductive layer 1607, a first dielectric layer 1617, a second conductive layer 1608, a second dielectric layer 1618, and a third conductive layer 1609.

In an example, the first conductive layer 1607 can include source contact metal 1601. The source contact metal 1601 can overlie a plurality of trenched gate structures 1615 to form an active area of the device 1600. The second conductive layer 1608, separated from the first conductive layer 1607 by the first dielectric layer 1617, can include a drain conductor 1620 and a gate conductor 1622. In an example, the drain conductor can be coupled to the substrate 1613 using a drain substrate via 1614 extending through the first dielectric layer 1617. In an example, the drain conductor 1620 can overlie the source contact metal 1601. In an example, the gate conductor 1622 can be coupled to a gate runner using a gate via (not shown) extending through the first dielectric layer 1617.

In an example, the third conductive layer 1609, separated from the second conductive layer 1608 by the second dielectric layer 1618, can include a drain pad 1630, a gate pad (not shown) and a source pad 1631. In an example, the source pad 1631 can be coupled to the source contact metal 1601 using one or more source vias 1641 extending through dielectric material, such as the first and second dielectric layers 1617, 1618, positioned between the first conductive layer 1607 and the third conductive layer 1609. In an example, the drain pad 1630 can be coupled to the drain conductor 1620 using one or more drain vias 1640 extending through the second dielectric layer 1618. In an example, the gate pad (not shown) can be coupled to the gate conductor 1622 using one or more vias extending through the second dielectric layer 1618. In certain examples, one or more of the drain pad 1630, the gate pad (not shown), or the source pad 1631 can each include planar top surface such as the drain pad planar top surface 1650 or the source pad planar top surface 1651. In an example, the planar top surfaces can be coplanar to form a CSP device. In certain examples, each of the pads can include bondable materials, such as, aluminum, gold, or other metals used in conjunction with wire bonding applications. In an example, each of the pads can include solderable materials, such as solderable metal including copper, silver, tin, chrome, pr any underlying barrier metal or combination of metal to form a metallic surface.

Figure 17:
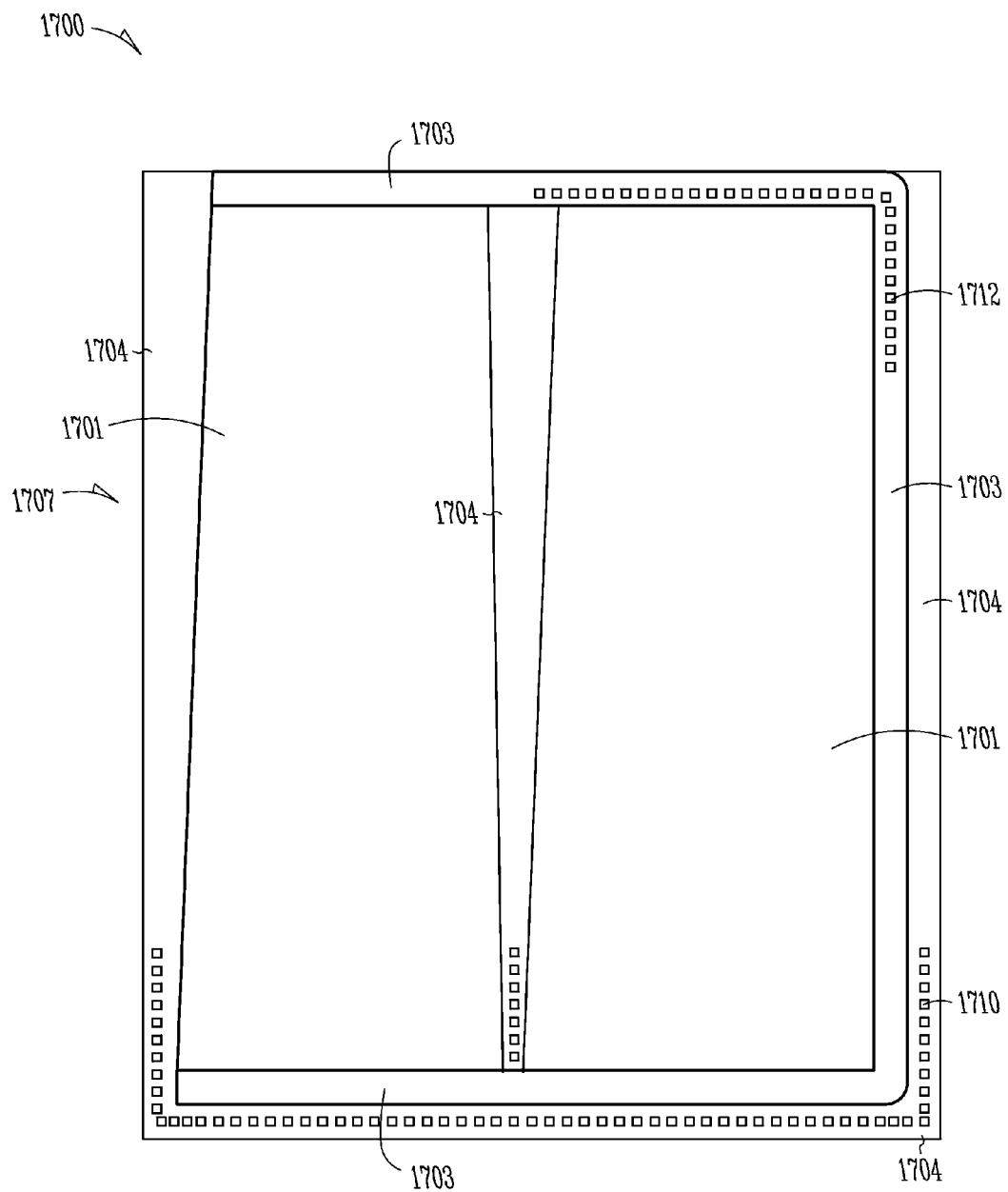
FIG. 17 illustrates generally top view of a first conductive layer example of a device, such as a multi-level power MOSFET device.

FIG. 17 illustrates generally an example cross-section view of a first conductive layer 1707 of a device 1700, such as a multi-level power MOSFET device. In an example, the first conductive layer 1707 can include drain contact metal 1704, at least a portion of a gate runner 1703 (e.g., a conductive portion of the gate runner 1703), and source contact metal 1701. In an example, the cross-section view of the device 1700 includes example locations of drain vias 1710 and gate vias 1712 configured to couple the drain contact metal 1704 and the gate runners 1703 to overlying conductive layers.

In the example cross-section view of FIG. 17, the drain contact metal 1704, the source contact metal 1701, and conductive components of the gate runners 1703 are isolated from each other. In an example, the drain contact metal 1704 and the conductive portion of the gate runners 1703 can extend about a portion of the perimeter of the device 1700. In an example, a portion of the drain contact metal 1703 can bisect the source contact metal 1701 near the middle of the device 1700.

In certain examples, the drain contact metal 1704 can vary in width as it extends across the device 1700. In an example, the width of the drain contact metal 1704 can taper along its length. In an example, the drain contact metal 1704 can increase in width as it extends away from the drain vias 1710 coupling the drain contact metal 1704 to drain pads. In an example, the drain contact metal 1704 can change width along its length incrementally, which can reduce the resistance of the drain contact metal 1704 path and can improve the performance of the device 1700.

It is understood that other first conductive layer 1707 layouts are possible without departing from the scope of the present subject matter. Such layouts can include gate runners that vary in width from one another, gate runners that vary in width along a length of the gate runner, or one or more other layouts.

In certain examples, a multi-level device can include sensor components, such as temperature sense, current sense, diode, or resistor components. In an example, terminals of a sensor component can take advantage of the multi-level nature of the present subject matter such that the sensor and sensor terminals can maximize the active area of the component. For example, a sensor component integrated with a power MOSFET can use one or more vias to couple the component to bondable terminals at the exterior of the integrated device. In devices that incorporate the bond pads at the substrate surface, the area under the bond pads are inactive and can be quite substantial. The one or more vias extending between conductive layers of the integrated, multi-level device can maximize the active area at the surface of the device substrate.

It is understood that semiconductor devices incorporating the present subject matter can include, but are not limited to, power Metal Oxide Semiconductor (MOS) Field-Effect Transistors (FETs), planar MOSFETs, Double Diffusion MOS (DMOS), Drain-in-the-back DMOS, Trench MOSFETs, including charge bound devices such as shielded gate devices, Insulated Gate Bipolar Transistors (IGBTs), Lateral diffused Metal Oxide Semiconductor (LDMOS), MOS-Controlled Thyristors (MCTs) and temperature sense and current sense MOS devices. In an example, source contact metal can include, but is not limited to, aluminum (Al), aluminum silicon (AlSi), aluminum silicon copper (AlSiCu), copper (Cu), or one or more other metals or combinations thereof and can include an underlying barrier metal including, but not limited to, Tungsten (W), Platinum (Pt), Titanium (Ti), Titanium Tungsten (TiW), or Titanium Nitride (TiN). In certain examples, gate structures and source structures can include a metal layer including, but not limited to, aluminum (Al), aluminum silicon copper (AlSiCu), electroless nickel gold (ENiAu), titanium nickel silver (TiNiAg), titanium nickel vanadium silver (TiNiVAg), copper (Cu), solderable metals such as Tin (Sn), or one or more other metals or combinations thereof.

Additional Notes

In Example 1, a semiconductor device can include a substrate, a first device surface overlying the substrate, the first device surface including at least three pads. The at least three pads can include a drain pad, a gate pad, and a source pad. The semiconductor device can also include a plurality of trenched gate structures coupled to the gate pad, the plurality of trenched gate structures configured to control a flow of electrical current between the source pad and the drain pad when a voltage is applied to the gate pad, and a first conductive layer. The first conductive layer can include a drain contact, the drain contact coupled to the drain pad, a gate runner, the gate runner coupled to the gate pad, and a source contact coupled between the source pad and the plurality of trenched gate structures. The semiconductor device can also include a second conductive layer, at least a portion of the second conductive layer separated from at least a portion of the first conductive layer using a dielectric, wherein the second conductive layer includes a drain conductor, at least a portion of the drain conductor overlying at least a portion of the gate runner, wherein the drain conductor is coupled to the drain contact.

In Example 2, a portion of the drain conductor of Example 1 can optionally overlie at least a portion of the source contact.

In Example 3, the drain conductor of Examples 1 or 2 optionally includes the drain pad.

In Example 4, the semiconductor device of any one or more of Examples 1-3 optionally includes a drain via coupling the drain contact to the drain pad.

In Example 5, the semiconductor device of any one or more of Examples 1-4 optionally includes a gate via configured to couple the gate runner with the gate pad.

In Example 6, the gate runner of any one or more of Examples 1-5 optionally includes polycrystalline silicon.

In Example 7, the gate runner of any one or more of Examples 1-6 optionally includes a first metal overlying the polycrystalline silicon, wherein the first conductive layer includes the first metal.

In Example 8, the polycrystalline silicon of any one or more of Examples 1-7 optionally includes silicided polycrystalline silicon.

In Example 9, the substrate of any one or more of Examples 1-8 optionally includes a trench configured to support the gate runner.

In Example 10, the substrate of any one or more of Examples 1-9 optionally includes an epitaxial layer and wherein the epitaxial layer includes the trench.

In Example 11, the second conductive layer of any one or more of Examples 1-10 optionally includes a gate conductor coupled to the gate runner.

In Example 12, the gate conductor of any one or more of Examples 1-11 optionally includes the gate pad.

In Example 13, at least a portion of the gate conductor of any one or more of Examples 1-12 optionally overlies at least a portion of the source contact.

In Example 14, the second conductive layer of any one or more of Examples 1-13 optionally includes a source conductor coupled to the source contact. In Example 15, the source conductor of any one or more of Examples 1-14 optionally includes the source pad.

In Example 16, the semiconductor device of any one or more of Examples 1-15 optionally includes a third conductive layer, at least a portion of the third conductive layer separating and overlying at least a portion of the second conductive layer using a dielectric.

In Example 17, the third conductive layer of any one or more of Examples 1-16 optionally includes the at least three pads.

In Example 18, the at least three pads of any one or more of Examples 1-17 each optionally include a top surface substantially co-planar with one another.

In Example 19, the at least three pads of any one or more of Examples 1-18 optionally include solderable material.

In Example 20, the drain contact of any one or more of Examples 1-19 optionally has a substantially uniform width and extends about a perimeter of the semiconductor device.

In Example 21, the drain contact of any one or more of Examples 1-20 optionally has a tapered width and extends parallel to the plurality of trench gate structures.

In Example 22, the drain contact of any one or more of Examples 1-21 optionally has a substantially uniform width and extends parallel to the plurality of trench gate structures.

In Example 23, the drain contact of any one or more of Examples 1-22 optionally has a tapered width and extends perpendicular to the plurality of trench gate structures.

In Example 24, the drain contact of any one or more of Examples 1-23 optionally has a substantially uniform width and extends perpendicular to the plurality of trench gate structures.

In Example 25, the gate runner of any one or more of Examples 1-24 optionally includes a metallic compound.

Example 26 can include, or can optionally be combined with any portion or combination of any portions of any one or more of Examples 1-25 to include, subject matter that can include means for performing any one or more of the functions of Examples 1-25, or a machine-readable medium including instructions that, when performed by a machine, cause the machine to perform any one or more of the functions of Examples 1-25.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductor device comprising:
    a substrate;
    a first device surface overlying the substrate, the first device surface including at least three pads, wherein the at least three pads include:
        a drain pad;
        a gate pad; and
        a source pad;
    a plurality of trenched gate structures coupled to the gate pad, the plurality of trenched gate structures configured to control a flow of electrical current between the source pad and the drain pad when a voltage is applied to the gate pad;
    a first conductive layer including:
        a drain contact, the drain contact coupled to the drain pad;
        a gate runner, the gate runner coupled to the gate pad; and
        a source contact coupled between the source pad and the plurality of trenched gate structures; and
    a second conductive layer, at least a portion of the second conductive layer separated from at least a portion of the first conductive layer using a dielectric, wherein the second conductive layer includes a drain conductor, at least a portion of the drain conductor overlying at least a portion of the gate runner, wherein the drain conductor is coupled to the drain contact.

2. The semiconductor device of claim 1, wherein a portion of the drain conductor overlies at least a portion of the source contact.

3. The semiconductor device of claim 1, wherein the drain conductor includes the drain pad.

4. The semiconductor device of claim 3, including a drain via coupling the drain contact to the drain pad.

5. The semiconductor device of claim 1, including a gate via configured to couple the gate runner with the gate pad.

6. The semiconductor device of claim 1, wherein the gate runner includes polycrystalline silicon.

7. The semiconductor device of claim 6, wherein the gate runner includes a first metal overlying the polycrystalline silicon, wherein the first conductive layer includes the first metal.

8. The semiconductor device of claim 6, wherein the polycrystalline silicon includes silicided polycrystalline silicon.

9. The semiconductor device of claim 1, wherein the substrate includes a trench configured to support the gate runner.

10. The semiconductor device of claim 9, wherein the substrate includes an epitaxial layer and wherein the epitaxial layer includes the trench.

11. The semiconductor device of claim 1, wherein the second conductive layer includes a gate conductor coupled to the gate runner.

12. The semiconductor device of claim 11, wherein the gate conductor includes the gate pad.

13. The semiconductor device of claim 11, wherein at least a portion of the gate conductor overlies at least a portion of the source contact.

14. The semiconductor device of claim 1, wherein the second conductive layer includes a source conductor coupled to the source contact.

15. The semiconductor device of claim 14, wherein the source conductor includes the source pad.

16. The semiconductor device of claim 1, including a third conductive layer, at least a portion of the third conductive layer separating and overlying at least a portion of the second conductive layer using a dielectric.

17. The semiconductor device of claim 16, wherein the third conductive layer includes the at least three pads.

18. The semiconductor device of claim 1, wherein the at least three pads each include a top surface substantially co-planar with one another.

19. The semiconductor device of claim 1, wherein the at least three pads include solderable material.

20. The semiconductor device of claim 1, wherein the drain contact has a substantially uniform width and extends about a perimeter of the semiconductor device.

21. The semiconductor device of claim 1, wherein the drain contact has a tapered width and extends parallel to the plurality of trench gate structures.

22. The semiconductor device of claim 1, wherein the drain contact has a substantially uniform width and extends parallel to the plurality of trench gate structures.

23. The semiconductor device of claim 1, wherein the drain contact has a tapered width and extends perpendicular to the plurality of trench gate structures.

24. The semiconductor device of claim 1, wherein the drain contact has a substantially uniform width and extends perpendicular to the plurality of trench gate structures.

25. The semiconductor device of claim 1, wherein the gate runner includes a metallic compound.

* * * * *